(12) United States Patent
Saito et al.

(10) Patent No.: US 12,302,511 B2
(45) Date of Patent: May 13, 2025

(54) ELECTRONIC DEVICE FOR RESISTING HIGH-PRESSURE LIQUID WITH BREATHABLE FILTER

(71) Applicant: HITACHI ASTEMO, LTD., Ibaraki (JP)

(72) Inventors: Masato Saito, Hitachinaka (JP); Michihito Watarai, Hitachinaka (JP)

(73) Assignee: HITACHI ASTEMO, LTD., Ibaraki (JP)

( * ) Notice: Subject to any disclaimer, the term of this patent is extended or adjusted under 35 U.S.C. 154(b) by 472 days.

(21) Appl. No.: 17/776,468

(22) PCT Filed: Oct. 20, 2020

(86) PCT No.: PCT/JP2020/039324
§ 371 (c)(1),
(2) Date: May 12, 2022

(87) PCT Pub. No.: WO2021/095453
PCT Pub. Date: May 20, 2021

(65) Prior Publication Data
US 2022/0408572 A1 Dec. 22, 2022

(30) Foreign Application Priority Data
Nov. 12, 2019 (JP) ................................. 2019-204698

(51) Int. Cl.
*H05K 5/02* (2006.01)
*H01R 13/50* (2006.01)
(Continued)

(52) U.S. Cl.
CPC ........... *H05K 5/0214* (2022.08); *H01R 13/50* (2013.01); *H01R 13/52* (2013.01);
(Continued)

(58) Field of Classification Search
CPC .. H05K 5/0214; H05K 5/0069; H05K 5/0215; H05K 5/0047; H05K 5/0056;
(Continued)

(56) References Cited

U.S. PATENT DOCUMENTS

2003/0094101 A1 5/2003 Hara et al.
2017/0223847 A1 8/2017 Nishida et al.

FOREIGN PATENT DOCUMENTS

| JP | 2003152347 A | * | 5/2003 | ......... B29C 65/5057 |
| JP | 2014164825 A | * | 9/2014 | |

(Continued)

OTHER PUBLICATIONS

International Search Report for International Application No. PCT/JP2020/039324 mailed Jan. 19, 2021. 3 pages.

*Primary Examiner* — Justin M Kratt
(74) *Attorney, Agent, or Firm* — Volpe Koenig

(57) ABSTRACT

An electronic device maintains a pressure adjustment function of a breathable filter. The electronic device includes a connector that includes a connector housing that closes an opening portion of a housing accommodating a circuit board and holds a connection terminal enabling electric connection of the circuit board to an external connector and a communication hole that penetrates the connector housing and allows an internal space and an external space of the housing to communicate with each other, and a filter attached to the connector housing to cover a first opening that opens in the communication hole on an internal space side of the housing. The connector housing has a shielding wall surrounding the periphery of the second opening of the communication hole that opens to the external space side of the housing and protrudes toward the external space side of the housing from the second opening of the communication hole.

15 Claims, 22 Drawing Sheets

(51) Int. Cl.
*H01R 13/52* (2006.01)
*H01R 13/53* (2006.01)
*H01R 13/533* (2006.01)
*H05K 5/00* (2006.01)
*B60R 16/02* (2006.01)
*H01R 27/02* (2006.01)

(52) U.S. Cl.
CPC ......... *H01R 13/5202* (2013.01); *H01R 13/53* (2013.01); *H01R 13/533* (2013.01); *H05K 5/0069* (2013.01); *H05K 5/0215* (2022.08); *B60R 16/02* (2013.01); *H01R 27/02* (2013.01); *H05K 5/0047* (2013.01); *H05K 5/0056* (2013.01)

(58) Field of Classification Search
CPC .... H01R 13/50; H01R 13/52; H01R 13/5202; H01R 13/53; H01R 13/533; H01R 27/02; B60R 16/02
See application file for complete search history.

(56) References Cited

FOREIGN PATENT DOCUMENTS

| | | |
|---|---|---|
| JP | 2017-139057 A | 8/2017 |
| JP | 2019-83256 A | 5/2019 |

* cited by examiner

ELECTRONIC DEVICE FOR RESISTING HIGH-PRESSURE LIQUID WITH BREATHABLE FILTER

TECHNICAL FIELD

The present invention relates to a vehicle-mounted electronic device, d, an more particularly, to an electronic device including a connector.

BACKGROUND ART

An electronic device includes a housing that accommodates a circuit board, and a connector that is partially exposed from the housing and enables connection with an electric wire of an external device. In recent years, in the field of vehicles, an engine room has been narrowed in order to secure a space in a vehicle interior, and a degree of freedom in mounting and arrangement is required for an electronic device mounted in the engine room. For example, electronic devices are increasingly mounted on a lower side of a vehicle in an engine room. When the electronic device is mounted on the lower side of the vehicle, the electronic device may be submerged at the time of traveling such as a puddle of a roadway, or may be sprinkled with high-pressure water used at the time of cleaning the vehicle. Therefore, it is necessary to ensure durability against submersion and sprinkling.

Since the electronic device used in such an environment includes a waterproof structure that seals the inside of the housing, a breathing and ventilation structure having a breathable filter and vent hole for adjusting a pressure difference between the inside and outside of the device is provided. The breathable filter is a member that allows air to pass therethrough but does not allow water or foreign matters to pass therethrough in a normal use range. Even when the pressure difference occurs between the inside and the outside of the electronic device, the air flows to the inside or the outside of the electronic device through the breathable filter and the vent hole, and thus, the pressure difference between the inside and the outside of the electronic device can be adjusted.

Some electronic devices having a breathing and ventilation structure include a breathable filter and a vent hole provided not on the housing side but on the connector side (for example, refer to PTL 1). In a waterproof control device (electronic device) described in PTL 1, a water-repellent filter (breathable filter) is fixed in close contact with an inner wall of a partition wall of a connector housing partially exposed from an opening of a housing that hermetically stores a circuit board, a water-shielding wall is disposed on three sides of an atmosphere open surface of a breathing vent hole that penetrates the partition wall and introduces outside air into the water-repellent filter, and a water-sprinkle preventing wall is provided on an upper portion or a lower portion of the water-shielding wall.

CITATION LIST

Patent Literature

PTL 1: JP 2017-139057 A

SUMMARY OF INVENTION

Technical Problem

Meanwhile, when excessive pressure of high-pressure water used for car washing or the like is directly applied to a breathable filter, the pressure exceeds water pressure resistance of the breathable filter, and there is a possibility that water enters the electron dc device. In addition, when droplets of the high-pressure water enter the vent hole and stay on the surface of the breathable filter, gas permeability (respiration) of the breathable filter is inhibited, and thus, a pressure adjustment function of the breathable filter may be lost. However, there is demand for a structure that prevents water from entering the inside of the electronic device and does not inhibit the pressure adjustment function of the breathable filter even when an external load such as the high-pressure water is generated.

In the waterproof control device described in PTL 1, a water-shielding wall is provided over a front surface of the atmosphere open surface of the breathing vent hole and two opposing directions around the front surface, and a water-sprinkle preventing wall is provided in the remaining one direction around the atmosphere open surface of the breathing vent hole. That is, a periphery of the breathing vent hole is surrounded by the water-shielding wall and the water-sprinkle preventing wall in three of the four directions, but the remaining one direction is always in the open state. Therefore, depending on the angle at which the high-pressure water is injected, a water-repellent filter may be directly sprinkled with water to exceed a filter withstand voltage. In this case, a liquid enters the control device through the water-repellent filter. Further, in the waterproof control device described in PTL 1, even when the water-repellent filter is not directly sprinkled with water, in a case where water stagnates in the breathing vent hole, air permeability may be impaired, and breathing of the water-repellent filter may be inhibited. In this case, the pressure adjustment function of the water-repellent filter is lost.

The present invention is made to solve the above problems, and an object thereof is to provide an electronic device capable of preventing water from entering the inside of the electronic device and maintaining a pressure adjustment function of a breathable filter.

Solution to Problem

The present application includes a plurality of means for solving the above problems, and examples thereof include a circuit board on which an electronic component is mounted, a housing that has an opening portion and accommodates the circuit board, a connector that includes a connection terminal that enables electrical connection of the circuit board to an external connector, and a connector housing that holds the connection terminal and closes the opening portion of the housing, and has a communication hole that penetrates the connector housing and allows an internal space and an external space of the housing to communicate with each other, and a filter which is attached to the connector housing so as to cover a first opening of the communication hole, the first opening being open to an internal space side of the housing and through which air passes, in which the connector housing includes a shielding wall that surrounds a periphery of second opening of the communication hole, the second opening being opened to an external space side of the housing, and protrudes toward the external space side of the housing from the second opening of the communication hole.

Advantageous Effects of Invention

According to the present invention, the shielding wall protruding toward the external space side surrounds the periphery of the second opening of the communication hole to protect the filter from a direct hit of high pressure water or the like, and suppress entry of high-pressure water or the like into the second opening of the communication hole, so that it is possible to prevent application of excessive pressure of liquid to the filter and to prevent complete closing of the communication hole. Therefore, it is possible to prevent the liquid from entering the inside of the device through the filter and to maintain the pressure adjustment function of the filter.

Problems, configurations, and effects other than the above will be clarified by the following description of embodiments.

DESCRIPTION OF EMBODIMENTS

Hereinafter, embodiments of an electronic device of the present invention will be described with reference to the drawings. The present embodiment will be described by exemplifying a case where the present invention is applied to an electronic control unit.

First Embodiment

Figure 1:
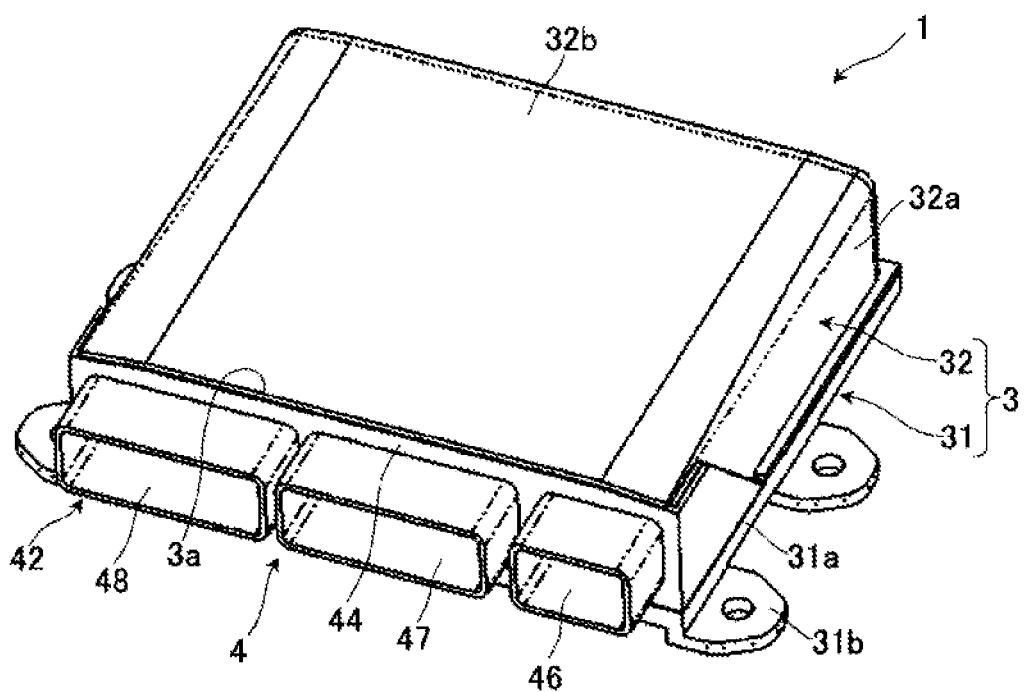
FIG. 1 is a perspective view illustrating an electronic control unit as an electronic device according to a first embodiment of the present invention.
Figure 2:
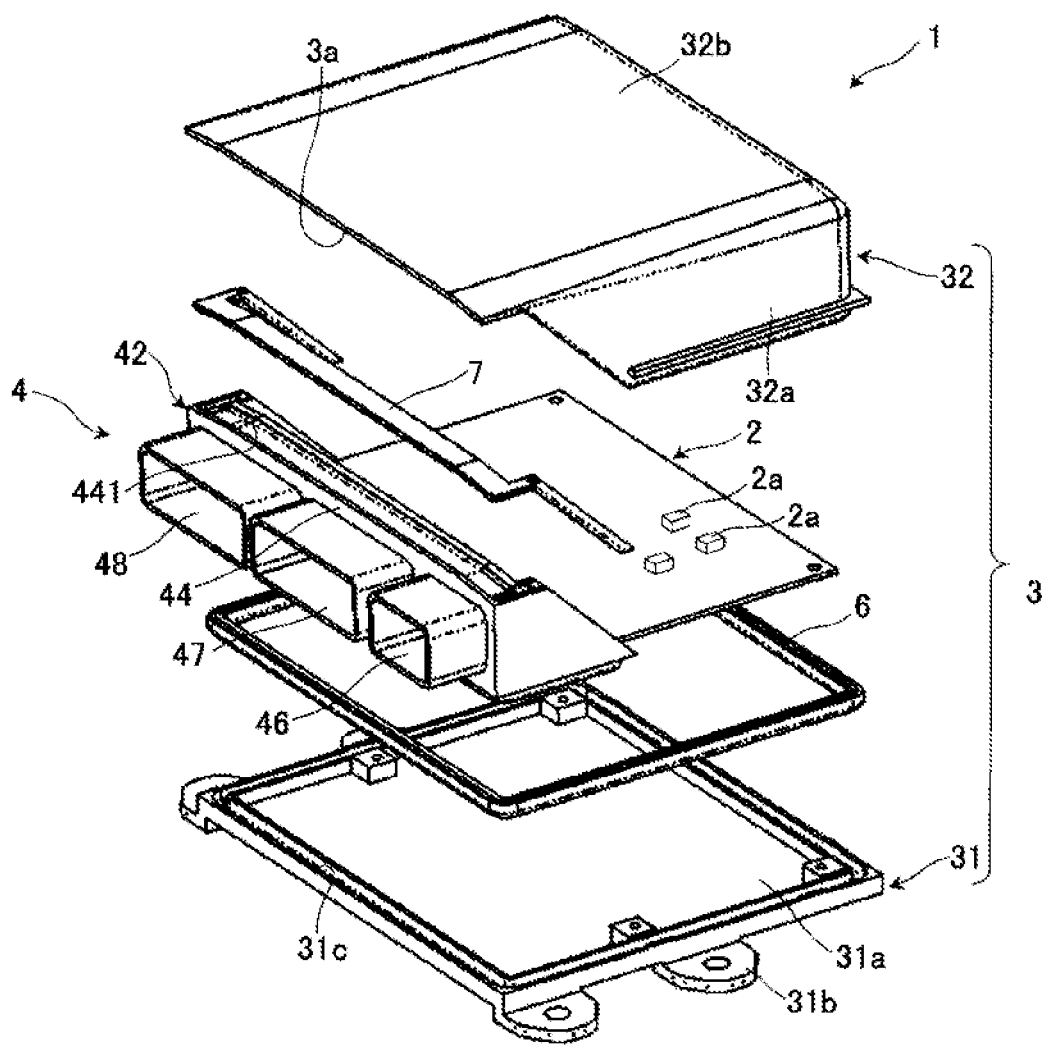
FIG. 2 is an exploded perspective view illustrating the electronic device according to the first embodiment of the present invention illustrated in FIG. 1.
Figure 3:
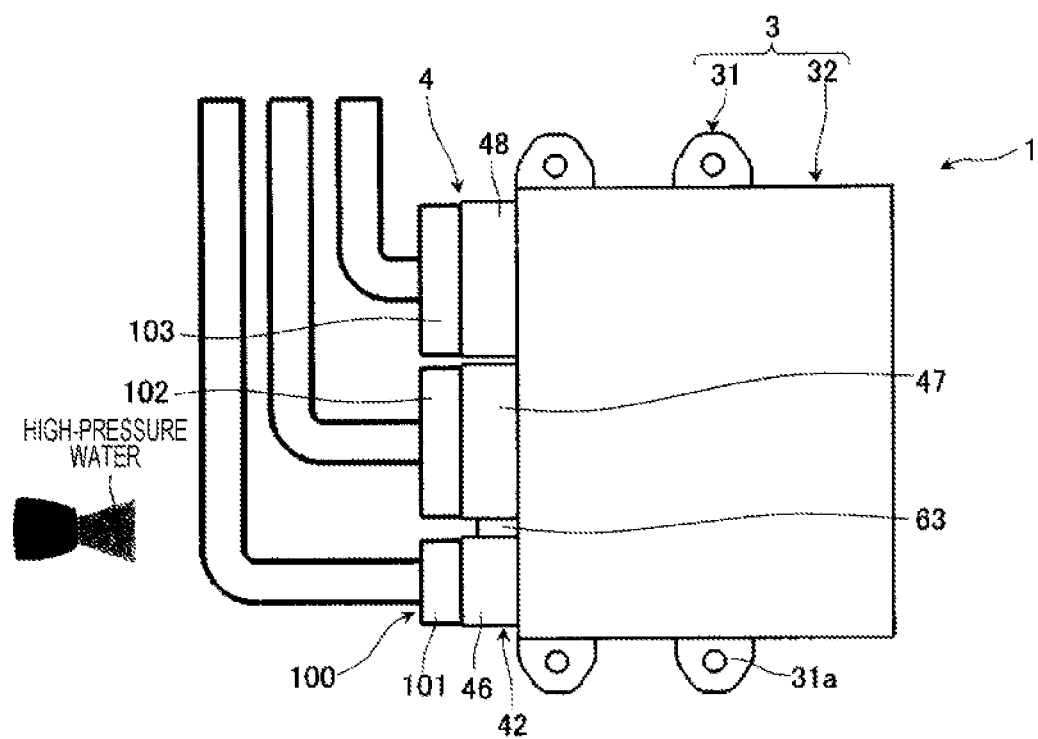
FIG. 3 is a plan view illustrating a connection state with an external electric wire in the electronic device according to the first embodiment of the present invention.

First, a configuration of an electronic control unit as an electronic device according to a first embodiment of the present invention will be described with reference to FIGS. 1 to 3. FIG. 1 is a perspective view illustrating the electronic control unit as the electronic device according to the first embodiment of the present invention. FIG. 2 is an exploded perspective view of the electronic device according to the first embodiment of the present invention illustrated in FIG. 1. FIG. 3 is a plan view illustrating a connection state with an external electric wire in the electronic device according to the first embodiment of the present invention.

In FIGS. 1 and 2, for example, the electronic control unit 1 constitutes an engine control unit (ECU) that controls operation of an engine of vehicle, an automatic transmission control unit that controls switching of an automatic transmission of the vehicle, and the like, and is mounted in an engine room of the vehicle. The electronic control unit 1 includes a circuit board 2 on which an electronic component 2a is mounted, a housing 3 that accommodates the circuit board 2, and a connector 4 for electrically connecting an external connector 100 (refer to FIG. 3) of a harness connected to an external device (not illustrated) to the circuit board 2.

The housing 3 has, for example, a box shape having an opening portion 3a on one side, and includes a base 31 to which the circuit board 2 is fixed, and a cover 32 that forms an internal space for accommodating the circuit board 2 together with the base 31. The opening portion 3a of the housing is closed by the connector 4.

The base 31 includes, for example, a flat plate portion 31a having a rectangular shape as a main body and a plurality of attachment portions 31b protruding from the flat plate portion 31a. A first groove portion 31c having an annular shape is formed in an annular frame portion provided on an outer peripheral edge of the flat plate portion 31a of the base 31. A first seal member having an annular shape 6 is disposed in the first groove portion 31c. The base 31 is formed of a resin material such as polybutylene terephthalate (PBT), polyphenylene sulfide (PPS), or nylon (PA), or a metal material containing aluminum, iron, or the like as a main component.

The cover 32 includes a peripheral wall portion 32a that is configured to rise with respect to the flat plate portion 31a of the base 31 and surrounds three sides of the periphery of the circuit board 2, and a top surface portion 32b that is positioned on a side (upper side in FIG. 2) opposite to the flat plate portion 31a of the base 31 with the circuit board interposed therebetween, covers the circuit board 2, and is integrally molded with the peripheral wall portion 32a in a state of facing the circuit board 2. The cover 32 is configured such that a peripheral edge portion of the peripheral wall portion 32a is disposed in the first groove portion 31c of the base 31. Similarly to the base 31, the cover 32 is formed of a resin material such as polybutylene terephthalate (PBT), polyphenylene sulfide (PPS), or nylon (PA), or a metal material containing aluminum, iron, or the like as a main component.

The connector 4 includes a connection terminal 41 (refer to FIG. 4 described later) that enables electrical connection of the circuit board 2 to the external connector 100, and a connector housing 42 that holds the connection terminal 41. The connection terminal 41 is formed of, for example, a metal material containing copper as a main component. The connector housing 42 is formed of a resin material such as polybutylene terephthalate (PBT), polyamide (PA), or polyphenylene sulfide (PPS), and is molded by pouring the resin material into a mold. In the present embodiment, as illustrated in FIG. 3, the connector 4 is configured to be connectable to a first external connectors 101, a second external connector 102, and a third external connector 103, which are three external connectors 100.

Specifically, the connection terminal 41 of the connector 4 includes a plurality of first connection terminals 41a (refer to FIG. 4) that can be electrically connected to the first external connector 101, a plurality of second connection terminals 41b (refer to FIG. 4) that can be electrically connected to the second external connector 102, and a plurality of third connection terminals (not illustrated) that can be electrically connected to the third external connector 103. One side of each of the first connection terminal 41a, the second connection terminal 41b, and the third connection terminal is bonded to the circuit board 2 by soldering, press fitting, or the like.

As illustrated in FIGS. 1 to 3, for example the connector housing 42 includes a partition wall portion 44 that holds the plurality of first connection terminals 41a, the second connection terminals 41b, and the third connection terminals and closes the opening portion 3a of the housing 3, and a first connector fitting portion 46, a second connector fitting portion 47, and a third connector fitting portion 48 that protrude from an outer surface of the partition wall portion 44 toward an external space side of the housing 3 and can be fitted to the first external connector 101, the second external connector 102, and the third external connector 103, respectively.

In the partition wall portion 44, a second groove portion 441 is formed along a contact portion with the peripheral wall portion 32a of the cover 32 and the end edge portion of the top surface portion 32b. A second seal member 7 is disposed in the second groove portion 441.

Each of the first connector fitting portion 46, the second connector fitting portion 47, and the third connector fitting portion 48 is a tubular wall portion having a rectangular opening on one side. Each of the first connector fitting portion 46, the second connector fitting portion 47, and the third connector fitting portion 48 surrounds the plurality of first connection terminals 41a, the second connection terminals 41b, and the third connection terminals protruding from the outer surface of the partition wall portion 44 on the external space side. The first connector fitting portion 46, the second connector fitting portion 47, and the third connector fitting portion 48 are arranged in this order from one side to the other side (in FIG. 1, from the right side to the left side) of the partition wall portion 44 with a gap therebetween. That is, the second connector fitting portion 47 is disposed at a position between the first connector fitting portion 46 and the third connector fitting portion 48, and is adjacent to the first connector fitting portion 46 and the third connector fitting portion 48.

The base 31, the cover 32, and the connector 4 are assembled to each other in a state were the peripheral edge portion of the peripheral wall portion 32a of the cover 32 and a part of the end edge portion of the partition wall portion 44 of the connector 4 are pushed into the first groove portion 31c of the base 31 in which the first seal member 6 is disposed, and the end edge portions of the peripheral wall portion 32a and the top surface portion 32b of the cover 32 are pushed into the second groove portion 441 of the connector 4 in which the second seal member 7 is disposed, whereby the waterproof property of the electronic control unit 1 is secured. As the first seal member 6 and the second seal member 7, an adhesive made of a material such as a silicon based material, an epoxy-based material, or a urethane-based material, or an O-ring made of a rubber-based material can be used.

The electronic control unit 1 configured to be in a sealed state by assembling the base 31 and the cover 32 of the housing 3 and the connector 4 that closes the opening portion 3a of the housing 3 via the first seal member 6 and the second seal member 7. Therefore, the electronic control unit 1 configured in the sealed state has a breathing structure for adjusting a pressure difference between the inside and the outside.

Figure 4:
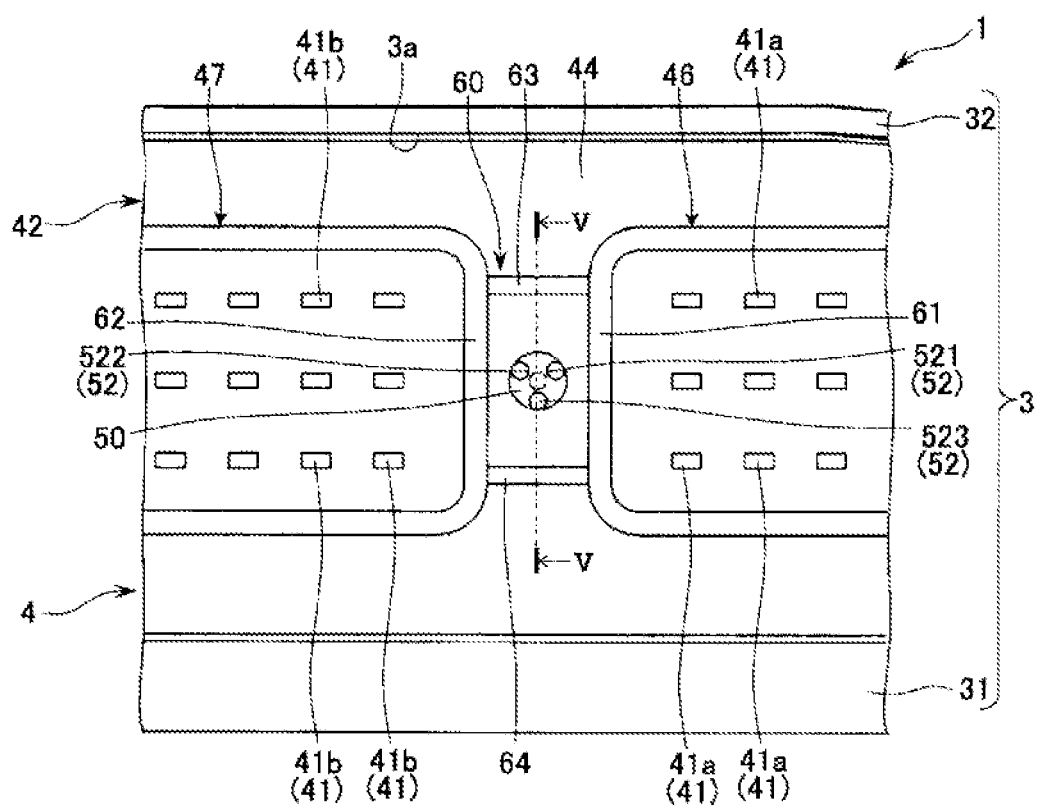
FIG. 4 is an enlarged view illustrating a breathing structure and a peripheral structure thereof when the electronic device according to the first embodiment of the present invention is viewed from a connector side.
Figure 5:
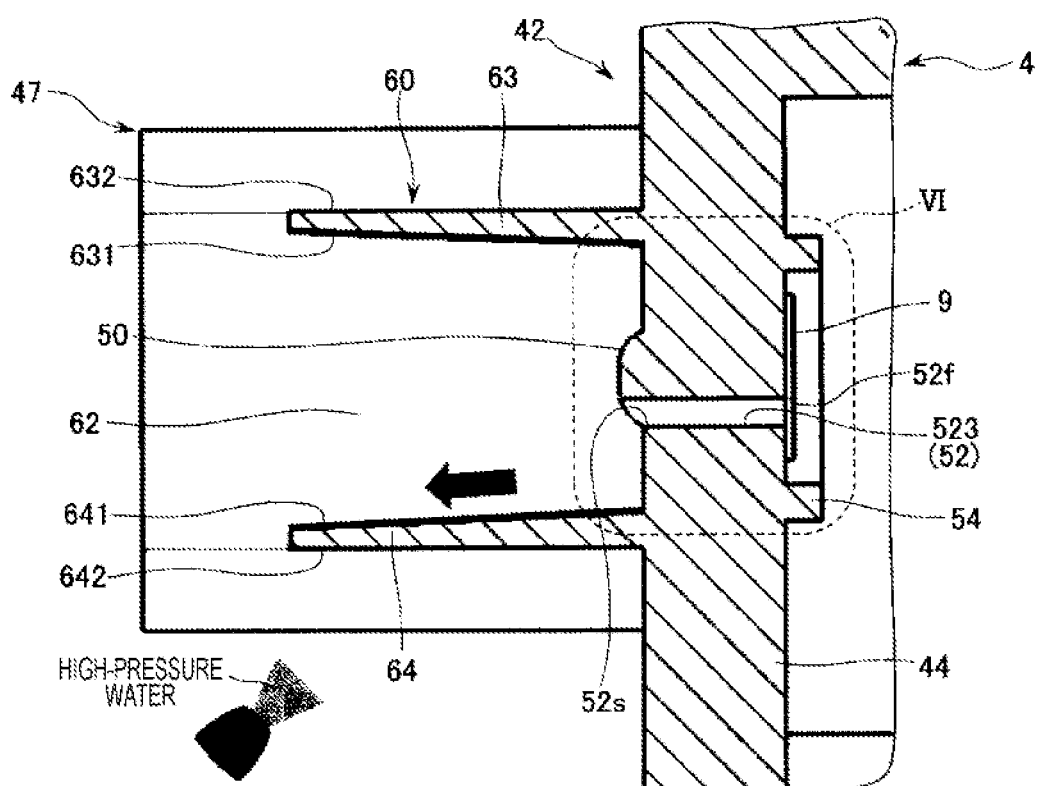
FIG. 5 is a cross-sectional view of the breathing structure in the electronic device according to the first embodiment of the present invention as viewed from arrows V-V illustrated in FIG. 4.
Figure 6:
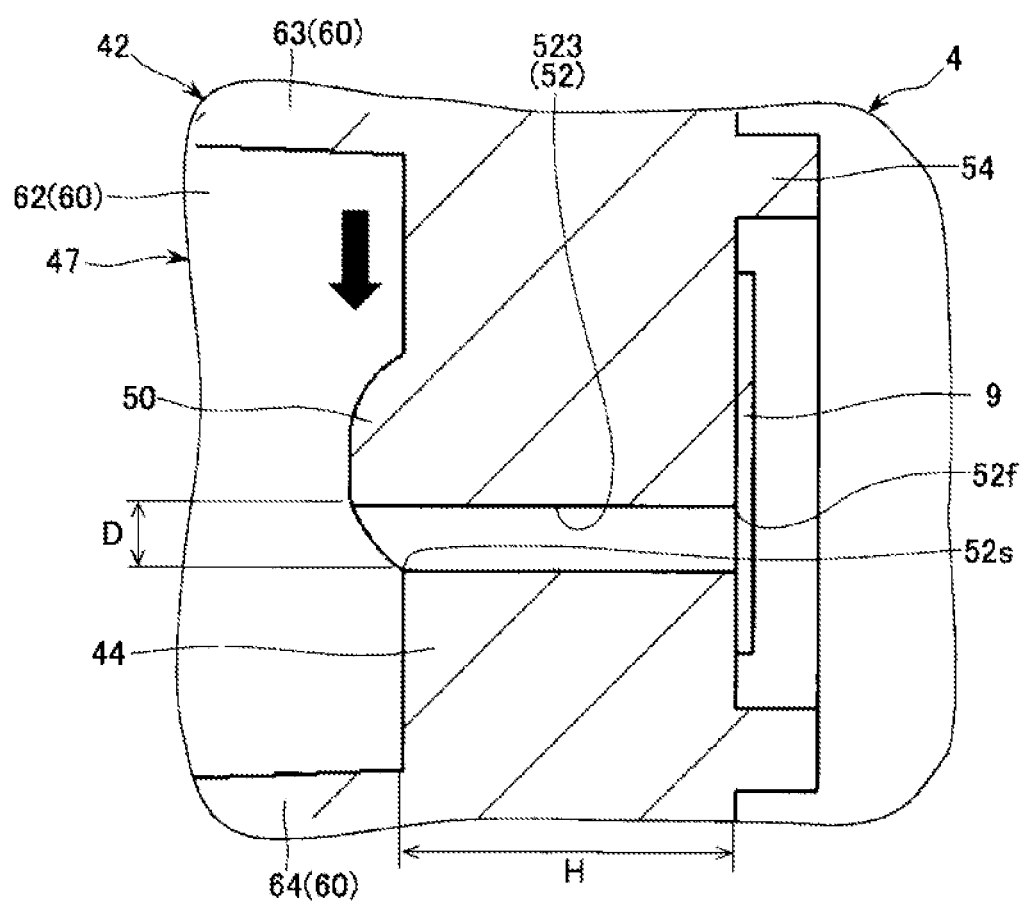
FIG. 6 is an enlarged cross-sectional view illustrating the breathing structure of the electronic device according to the first embodiment of the present invention indicated by a reference sign VI in FIG. 5.

Next, a breathing structure of the electronic device according to the first embodiment of the present invention will be described with reference to FIGS. 4 to 6. FIG. 4 is an enlarged view illustrating the breathing structure and peripheral structure thereof when the electronic device according to the first embodiment of the present invention is viewed from the connector side. FIG. 5 is a cross-sectional view of the breathing structure in the electronic device according to the first embodiment of the present invention as viewed from arrows V-V illustrated in FIG. 4. FIG. 6 is an enlarged cross-sectional view illustrating the breathing structure of the electronic device according to the first embodiment of the present invention indicated by reference sign VI in FIG. 5. In FIGS. 5 and 6, black arrows indicate water flows.

In FIGS. 4 and 5, in the connector housing 42 of the connector 4, a convex portion 50 bulging toward the external space side of the housing 3 is provided between the first connector fitting portion 46 and the second connector fitting portion 47 on the outer surface of the partition wall portion 44. The convex portion 50 is formed so as to gradually expand from the peripheral portion toward the central portion and have the central portion as a top portion. For example, the convex portion 50 is formed such that the outer surface thereof has a curved surface (spherical surface) having a constant curvature.

In addition, the connector housing 42 is provided with a breathing hole group 52 that penetrates the partition wall portion 44 and allows the internal space and the external space of housing 3 to communicate with each other, and the breathable filter 9 is attached so as to cover all first openings 52f of the breathing hole group 52 that open to the internal space side of the housing 3. On an inner surface of partition wall portion 44 on the internal space side of housing 3, an annular ridge portion 54 is provided so as to surround the periphery of the breathable filter 9. The breathable filter 9 is formed of a nonwoven fabric mainly made of PTFE or the like, and is a member that allows a gas such as air to pass therethrough and does not allow foreign matters or water to pass therethrough under a pressure within a predetermined range. The breathing hole group 52 and the breathable filter 9 have a function of adjusting pressure inside the electronic control unit 1.

The breathing hole group 52 includes three through holes, for example, a first communication hole 521, a second communication hole 522, and a third communication hole 523. The first communication hole 521, the second communication hole 522, and the third communication hole 523 are formed such that the second opening 52s opened to the external space side of the housing 3 is located on the surface of the convex portion 50. The first communication hole 521, the second communication hole 522, and the third communication hole 523 are arranged so as to be shifted from each other with respect to the arrangement of the other two holes, and for example, the second opening 52s is arranged along the peripheral edge portion of the convex portion 50. The first communication hole 521, the second communication hole 522, and the third communication hole 523 are formed such that distances between the second openings 52s of adjacent holes are the same. That is, first communication holes 521, the second communication holes 522, and the third communication holes 523 are arranged at equal intervals (intervals at a central angle of 120° about the top portion of the convex portion 50) in the circumferential direction at the peripheral edge portion of the substantially spherical convex portion 50, and are formed so as not to be arranged in a line. The first communication hole 521, the second communication hole 522, and the third communication hole 523 are, for example, round holes (circular outline shape).

Further, the first communication hole 521, the second communication hole 522, and the third communication hole 523 have, for example, the same hole diameter and the same length, and as illustrated in FIG. 6, H≥D is satisfied when each hole diameter is D and each hole length is H (in FIG. 6, only the hole diameter and the length of the third communication hole 523 are illustrated). The breathing hole group 52 is formed such that ventilation resistance (Rh) of all the first communication hole 521, the second communication hole 522, and the third communication hole 523 is equal to or less than ventilation resistance (Rf) of the breathable filter 9.

On the outer surface of the partition wall portion 44 of the connector housing 42 on the external space side of the housing 3, there is provided a shielding wall 60 that surrounds the periphery of the second opening 52s of the breathing hole group 52 including the first communication hole 521, the second communication hole 522, and the third communication hole 523, and protrudes toward the external space side of the housing 3 from the second opening 52s. The shielding wall 60 includes a first wall portion 61 constituted by a portion of the first connector fitting portion 46 (tubular wall portion) located on the second connector fitting portion 47 side, a second wall portion 62 provided at a position facing the first wall portion 61 and constituted by a portion or the second connector fitting portion 47 (tubular wall portion) located on the first connector fitting portion 46 side, a third wall portion 63 linearly connecting an end portion of the first wall portion 61 on the cover 32 side (upper side in FIGS. 4 and 5) and an end portion of the second wall portion 62 on the cover 32 side, and a fourth wall portion 64 provided on the site opposite to the third wall portion 63 across the second opening portion 52s of the breathing hole group 52 and linearly connecting an end portion of the first wall portion 61 on the base 31 side (lower side in FIGS. 4 and 5) and an end portion of the second wall portion 62 on the base 31 side. As illustrated in FIG. 5, the shielding wall 60 is configured such that inner surfaces 631 and 641 (in FIG. 5, only the third wall portion 63 and the fourth wall portion 64 are illustrated) located on the breathing hole group 52 side of the first wall portion 61, the second wall portion 62, the third wall portion 63, and the fourth wall portion 64 are gradually inclined toward the outer surfaces 632 and 642 sides of the shielding wall 60 from the base side toward the tip side. In other words, the inner surfaces of the first wall portion 61, the second wall portion 62, the third wall portion 63, and the fourth wall portion 64 of the shielding wall 60 are inclined such that the area surrounded by the shielding wall 60 increases from the base side toward the tip side.

Figure 7:
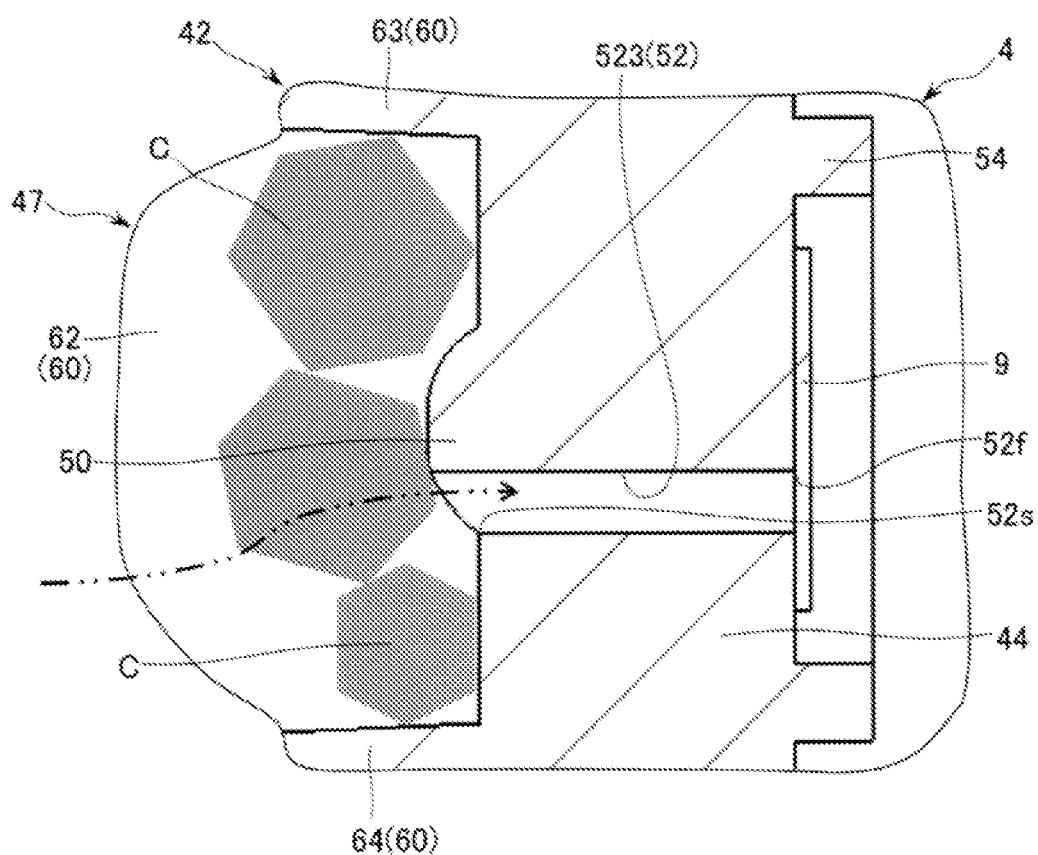
FIG. 7 is an explanatory diagram illustrating an operation of the breathing structure of the electronic device according to the first embodiment of the present invention.

Next, an operation of a breathing structure in the electronic device according to the first embodiment of the present invention will be described with reference to FIGS. 3 to 7. FIG. 7 is an explanatory diagram illustrating the operation of the breathing structure of the electronic device according to the first embodiment of the present invention. In FIG. 7, a two-dot chain line indicates the flow of air.

In the electronic control unit 1 mounted in an engine room of a vehicle, the electronic control unit 1 may be sprinkled with water splashes during traveling a puddle or the like of a roadway or high-pressure water used for cleaning the vehicle. However, in the present embodiment, as illustrated in FIGS. 4 and 5, the high-pressure water scattering toward the second opening 52s of the first to third communication holes 521, 522, and 523 is shielded by the shielding wall 60, and thus, it is possible to prevent a direct hit of the high-pressure water to the breathable filter 9. Therefore, even when a liquid reaches the breathable filter 9 via the first communication hole 521, the second communication hole 522, and the third communication hole 523, an excessive pressure is not applied to the breathable filter 9, and entry of the liquid into the housing 3 of the electronic control unit 1 can be prevented.

In the present embodiment, as illustrated in FIG. 3, when the first external connector 101 and the second external connector 102 are fitted to the first connector fitting portion 46 and the second connector fitting portion 47 of the connector 4, respectively, a part of the harness can be arranged at a position facing the second opening 52s of the first to third communication holes 521, 522, and 523. In this case, since a part of the harness functions as a shielding wall shields the opening direction side of the second opening 52s of the first to third communication holes 521, 522, and 523, even when the high-pressure water scatters from the front surface of the connector 4, a direct hit to the second opening 52s of the first to third communication holes 521, 522, and 523 can be prevented. Therefore, an excessive pressure is not applied to the breathable filter 9, and it is possible to prevent liquid from entering the housing 3 of the electronic control unit 1.

Further, in the present embodiment, as illustrated in FIG. 4, by forming three communication holes instead of one communication hole connected to the breathable filter (filter) 9, it is possible to reduce the hole diameters of the communication holes 521, 522, and 523 while securing a necessary air flow rate. Therefore, even when the high-pressure water directly hits the first to third communication holes 521, 522, and 523, since the resistance of the liquid when passing through the first to third communication holes 521, 522, and 523 increases, it is possible to prevent application of an excessive pressure to the breathable filter 9.

Further, in the present embodiment, the second openings 52s of the three first to third communication holes 521, 522, and 523 are prevented from being arranged on a straight line. As a result, no matter where the electronic control unit 1 is attached, the first to third communication holes 521, 522, and 523 are not aligned in a horizontal direction, and any one of the first to third communication holes 521, 522, and 523 is positioned relatively downward. Therefore, a water droplet flowing down on the outer surface of the connector housing 42 easily flows into the communication hole located above, and thus, it is possible to suppress the inflow into the communication hole located below. Even when any of the first to third communication holes 521, 522, and 523 is closed, air permeability of the remaining communication holes can be secured.

In the present embodiment, as illustrated in FIGS. 4 and 6, the second openings 52s of three first to third communication holes 521, 522, and 523 are located on the surface of the convex portion 50 that bulges toward the external space of the housing 3. In this case, even when moisture flowing down on the outer surface of the connector housing 42 flows along the surface of the convex portion 50, entry into the third communication hole located below the top portion of the convex portion 50 among the three first to third communication holes 521, 522, and 523 is suppressed. Therefore, it is possible to prevent the three first to third communication holes 521, 522, and 523 from being simultaneously closed.

Further, as illustrated in FIG. 7, even when foreign matters C adhere to the surface of the convex portion 50, the convex portion 50 protrudes outward, and thus, a gap can be secured between the second opening 52s the three first to third communication holes 521, 522, and 523 and the foreign matters C. Accordingly, the second opening 52s of the first to third communication holes 521, 522, and 523 can be prevented from being blocked by the foreign matters C, and thus, the air permeability of the first to third communication holes 521, 522, and 523 can be maintained.

An electronic control unit 1 as an electronic device according to the first embodiment of the present invention described above includes the circuit board 2 on which the electronic component 2a is mounted, the housing 3 that has the opening portion 3a and accommodates the circuit board 2, the connector 4 that includes the connection terminal 41 that enables electrical connection of the circuit board 2 to the external connector 100, and the connector housing 42 that holds the connection terminal 41 and closes the opening portion 3a of the housing 3, and has the communication holes 521, 522, and 523 that penetrate the connector housing 42 and allow an internal space and an external space of the housing 3 to communicate with each other, and the breathable filter (filter) 9 which is attached to the connector housing 42 so as to cover the first openings 52f of the communication holes 521, 522, and 523, the first openings 52f being open to the internal space side of the housing 3 and through which air passes, in which the connector housing 42 includes the shielding wall 60 that surrounds the peripheries of the second openings 52s of the communication holes 521, 522, and 523, the second openings 52s being open to the external space side of the housing 3, and protrudes toward the external space side of the housing 3 from the second openings 52s of the communication hole 521, 522, and 523.

According to this configuration, the shielding wall 60 protruding toward the external spare side surrounds the peripheries of the second openings 52s of the first to third communication holes (communication holes) 521, 522, and 523 to protect the breathable filter (filter) 9 from a direct hit of high-pressure water or the like, and suppress entry of high-pressure water or the like into the second openings 52s of the first to third communication holes (communication holes) 521, 522, and 523. Accordingly, it is possible to prevent application of excessive pressure of liquid to the breathable filter (filter) 9 and to prevent complete blocking of the first to third communication holes (communication holes) 521, 522, and 523. Therefore, it is possible to prevent liquid from entering the inside of the device through the breathable filter (filter) 9 and to maintain the pressure adjustment function of the breathable filter (filter) 9.

Further, in the electronic control unit 1 according to the present embodiment, the connector housing 42 has the plurality of tubular connector fitting portions 46, 47, and 48 that protrude toward the external space side of the housing 3 and can be fitted to the external connector 100, the connector fitting portions 46, 47, and 48 are arranged at intervals from each other, and the first to third communication holes (communication holes) 521, 522, and 523 are formed such that the second opening 52s is positioned between the first connector fitting portion 46 and the second connector fitting portion 47 adjacent to the first connector fitting portion 46. According to this configuration, since the position of the second opening 52s of each of the first to third communication holes (communication holes) 521, 522, and 523 is sandwiched between the wall portions of the first connector fitting portion 46 and the second connector fitting portion 47, the wall portions of the first connector fitting portion 46 and the second connector fitting portion 47 can protect the breathable filter (filter) 9 from the direct hit of high-pressure water or the like, and the wall portions of the first connector fitting portion 46 and the second connector fitting portion 47 function as the shielding wall of the breathable filter 9.

In addition, in the electronic control unit 1 according to the present embodiment, the shielding wall 60 includes the first wall portion 61, the second wall portion 62 provided at a position facing the first wall portion 61, the third wall portion 63 connecting the first wall portion 61 and the second wall portion 62, and the fourth wall portion 64 provided on the side opposite to the third wall portion 63 across the positions of the first to third communication holes (communication holes) 521, 522, and 523 and connecting the first wall portion 61 and the second wall portion 62, the first wall portion 61 is configured by a part of the first connector fitting portion 46, and the second wall portion 62 is configured by a part of the second connector fitting portion 47. According to this configuration, since a part of the wall portion of each of the first connector fitting portion 46 and the second connector fitting portion 47 constitutes a part of the shielding wall 60, it is possible to simplify the structure of the connector housing 42 as compared with a case where the first connector fitting portion and the second connector fitting portion and the shielding wall are formed completely separately.

Furthermore, in the electronic control unit 1 according to the present embodiment, the shielding wall 60 includes the first wall portion 61, the second wall portion 62 provided at a position facing the first wall portion 61, the third wall portion 63 connecting the first wall portion 61 and the second wall portion 62, and the fourth wall portion 64 provided on the opposite side to the third wall portion 63 across the position of the communication hole and connecting the first will portion 61 and the second wall portion 62, and the shielding wall 60 is configured such that at least one inner surface 631 or 641 of the first wall portion 61, the second wall portion 62, the third wall portion 63, or the fourth wall portion 64 gradually inclines toward the outer surfaces 632 and 642 of the shielding wall 60 from the base side toward the tip side. According to this configuration, as illustrated in FIG. 5, the liquid that has entered the inside of the shielding wall 60 can be easily drained to the outside of the shielding wall 60 without being retained by the inclined inner surface 631 and 641 of the shielding wall 60. Therefore, the first to third communication holes (communication holes) 521, 522, and 523 can be protected from being blocked by liquid.

In addition, in the electronic control unit 1 according to the present embodiment, all of the inner surfaces 631 and 641 of the shielding wall 60 are configured to be gradually inclined toward the outer surfaces 632 and 642 of the shielding wall 60 from the base side toward the tip side. According to this configuration, even when the electronic control unit 1 is attached in any direction in the vehicle, the inner surfaces 631 and 641 of the wall portion located on the lower side of the shielding wall 60 are inclined downward from the base side toward the tip side, and thus, it is possible to discharge the liquid that has entered the inside of the shielding wall 60 to the outside of the shielding wall 60 without retaining the liquid.

An electronic control unit 1 as an electronic device according to the first embodiment of the present invention described above includes the circuit board 2 the electronic component 2a is mounted, the housing 3 that has the opening portion 3a and accommodates the circuit board 2, and the connector 4 that includes the connection terminal 41 that enables electrical connection of the circuit board 2 to the external connector 100, and the connector housing 42 that holds the connection terminal 41 and closes the opening portion 3a of the housing in which the connector has at least three communication holes c(communication holes) 521, 522, and 523 that penetrate the connector housing 42 and allow the internal space and the external space of the housing 3 to communicate with each other, the electronic device further includes the breathable filter (filter) 9 which is attached to the connector housing 42 so as to entirely cover the first opening 52f opened to the internal space side of the housing 3 in the at least three communication holes (communication holes) 521, 522, and 523 and through which air passes, and the at least three communication holes (communication holes) 521, 522, and 523 are formed such that at least one of second openings 52s opened to the external space side of the housing 3 is arranged to be shifted from a straight line.

According to this configuration, by forming at least three communication holes connected to the breathable filter (filter) 9, it is possible to reduce the hole diameters of the communication holes 521, 522, and 523 while securing a necessary air flow rate. Therefore, since the resistance of the liquid when passing through the first to third communication holes 521, 522, and 523 increases, it is possible to prevent application of an excessive pressure to the breathable filter (filter) 9. Further, by avoiding the alignment of the second openings 52s of the at least three first to third communication holes 521, 522, and 523 on a straight line, any one of the first to third communication holes 521, 522 and 523 is positioned relatively downward. Therefore, since a water droplet flowing down on the outer surface of the connector housing 42 flows into the communication hole located above, it is possible to suppress the inflow into the communication hole located below, and it is possible to secure the air permeability of any one of the first to third communication holes 521, 522, and 523. That is, it is possible to prevent the liquid from entering the inside of the device through the breathable filter (filter) 9 and to maintain the pressure adjustment function of the breathable filter (filter) 9.

In addition, in the electronic control unit 1 according to the present embodiment, the at least three first to third communication holes (communication holes) 521, 522, and 523 are formed such that the distances between the second openings 52s of the adjacent communication holes are the same. According to this configuration, since there is no deviation in the arrangement of the three first to third communication holes (communication holes) 521, 522, and 523, it is possible to avoid occurrence of easiness of entry of liquid into the first to third communication holes 521, 522, and 523 depending on the attachment position of the electronic control unit 1.

In addition, in the electronic control unit 1 according to the present embodiment, each of the at least three first to third communication holes 521, 522, and 523 is formed to satisfy H≥D, where D is the hole diameter of each of the communication holes 521, 522, and 523, and H is the length of each of the communication holes 521, 522, and 523. According to this configuration, since the pressure loss when the liquid passes through the first to third communication holes 521, 522, and 523 can increase, the water pressure applied to the breathable filter 9 can be reduced.

In addition, in the electronic control unit 1 according to the present embodiment, the at least three first to third communication holes 521, 522, and 523 are formed such that the ventilation resistance of the all the at least three communication holes is equal to or less than the ventilation resistance of the breathable filter (filter) 9. According to this configuration, it is possible to prevent the first to third communication holes 521, 522, and 523 from having excessively small hole diameters, and it is possible to secure the air flow rate without impairing the pressure adjustment function of the breathable filter (filter) 9.

In addition, in the electronic control unit 1 according to the present embodiment, the connector housing 42 bulges toward the external space side of the housing 3, the central portion of the connector housing has the convex portion 50 at the top portion, and the at least three first to third communication holes (communication holes) 521, 522, and 523 are formed such that the second openings 52s are all located on the surface of the convex portion 50. In this configuration, it is possible to position any one of the at least three first to third communication holes (communication holes) 521, 522, and 523 below the top portion of the convex portion 50 depending on the attachment position of the electronic control unit 1. In this case, when the liquid flowing down on the outer surface of the connector housing 42 flows along the surface of the convex portion 50, it is possible to suppress the entry of the liquid into the communication hole located below the top portion of the convex portion 50, and it is possible to prevent the at least three first to third communication holes (communication holes) 521, 522, and 523 from being blocked at the same time.

In addition, in the electronic control unit 1 according to the present embodiment, the at least three first to third communication holes (communication holes) 521, 522, and 523 are formed such that the second openings 52s are dispersedly arranged along the peripheral edge portion of the convex portion 50. According to this configuration, any one of the at least three first to third communication holes (communication holes) 521, 522, and 523 can be positioned below the top portion of the convex portion 50 regardless of the attachment position of the electronic control unit 1, and thus, it is possible to prevent the at least three first to third communication holes (communication holes) 521, 522, and 523 from being closed at the same time.

In addition, in the electronic control unit 1 according to the present embodiment, the convex portion 50 is formed such that its outer surface has a curved surface with a constant curvature. According to this configuration, since the surface shape of the convex portion 50 is spherical, it is easy to manufacture a mold of the connector housing 42 including the convex portion 50.

Modification of First Embodiment

Figure 8:
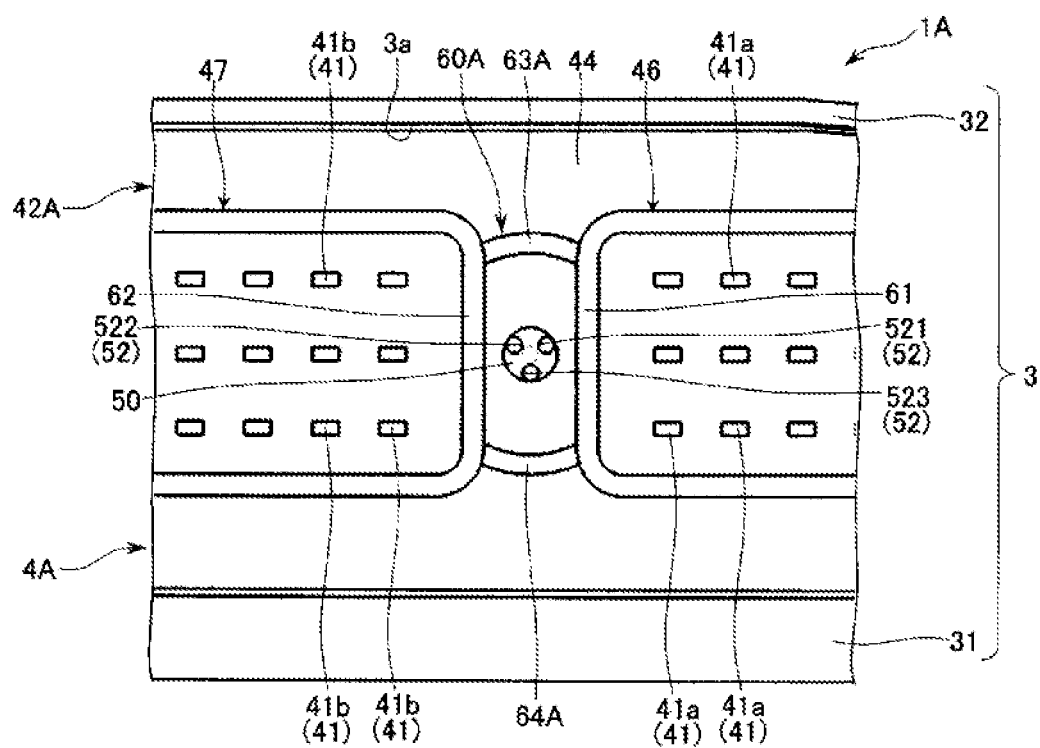
FIG. 8 is an enlarger view illustrating a breathing structure and a peripheral structure thereof when an electronic device according to a first modification of the first embodiment of the present invention is viewed from a connector side.
Figure 9:
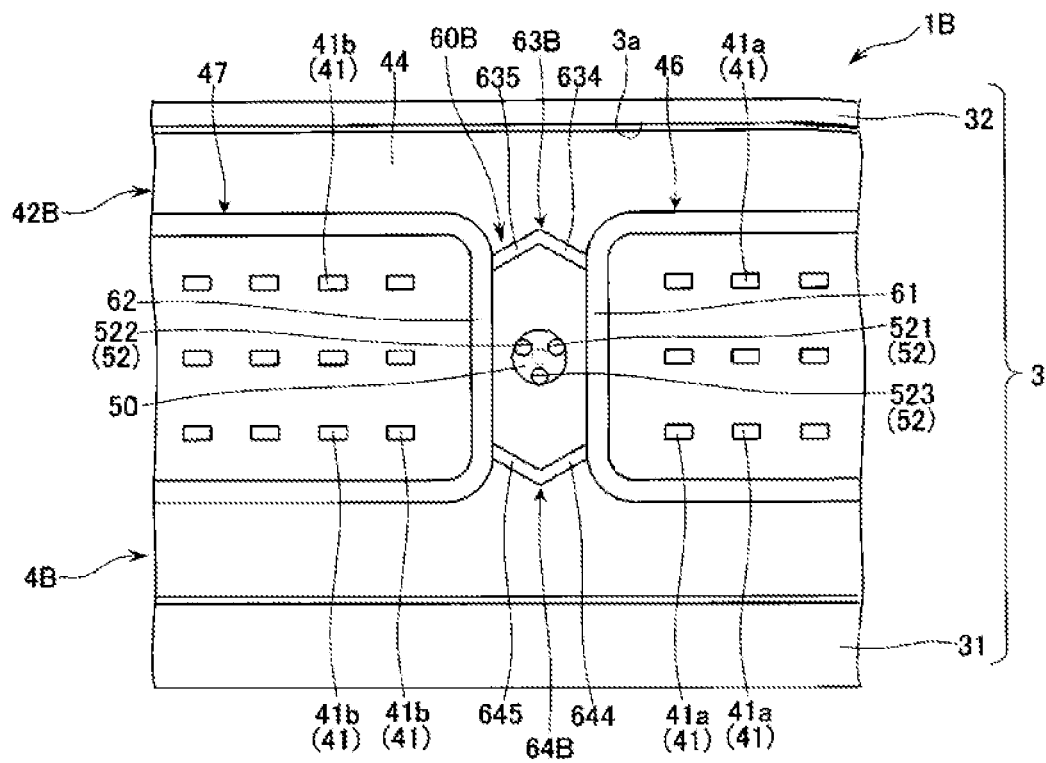
FIG. 9 is an enlarged view illustrating a breathing structure and a peripheral structure thereof when an electronic device according to a second modification of the first embodiment of the present invention is viewed from a connector side.

Next, electronic devices according to a first modification and a second modification of the first embodiment of the present invention will be described with reference to FIGS. 8 and 9. FIG. 8 is an enlarged view illustrating a breathing structure and a peripheral structure thereof when the electronic device according to the first modification of the first embodiment of the present invention is viewed from the connector side. FIG. 9 is an enlarged view illustrating a breathing structure and a peripheral structure thereof when the electronic device according to the second modification of the first embodiment of the present invention is viewed from the connector side. In FIGS. 8 and 9, components denoted by the same reference numerals as those illustrated in FIGS. 1 to 7 are similar parts, and thus, a detailed description thereof will be omitted.

An electronic control unit 1A according to the first modification of the first embodiment of the present invention illustrated in FIG. 8 is different from the electronic control unit 1 according to the first embodiment in that a shape of a shielding wall 60A of a connector housing 42A of a connector 4A is different. Structures other than the shielding wall 60A are the same as those of the first embodiment.

Specifically, a third wall portion 63A and a fourth wall portion 64A of the shielding wall 60A are each formed in a curved shape protruding in a direction away from the breathing hole group 52, specifically, in an arc shape. In addition, the third wall portion 63A and the fourth wall portion 64A are configured such that inner surfaces 631 and 641 thereof gradually incline toward the sides of outer surfaces 632 and 642 from the base side toward the tip side.

In addition, an electronic control unit 1B according to the second modification of the first embodiment of the present invention illustrated in FIG. 9 is different from the electronic control unit 1 according to the first embodiment in that a shape of a shielding wall 42B of a connector housing 60B of a connector 4B is different. Structures other than the shielding wall 60B are similar to those of the first embodiment. Specifically, in each of a third wall portion 63B and a fourth wall portion 64B of the shielding wall 60B, a central portion located between both end portions connected to the first connector fitting portion 46 and the second connector fitting portion 47 is bent in a direction away from the breathing hole group 52. In other words, each of the third wall portion 63B and the fourth wall portion 64B includes first inclined surface portions 634 and 644 connected to the first connector fitting portion 46 and second inclined surface portions 635 and 645 connected to the second connector fitting portion 47, and the connection portion between the first inclined surface portions 634 and 644 and the second inclined surface portions 635 and 645 is formed at a position farther from the breathing hole group 52 than the line segment connecting the connection portion between the first connector fitting portion 46 of the first inclined surface portions 634 and 644 and the connection portion between the second connector fitting portion 47 of the second inclined surface portions 635 and 645. Similarly to the first embodiment, the third wall portion 63B and the fourth wall portion 64B are configured such that the inner surfaces of the first inclined surface portions 634 and 644 and the second inclined surface portions 635 and 645 located on the breathing hole group 52 side are gradually inclined toward the outer surface side from the base side toward the tip side (refer to FIG. 5).

In the first modification and the second modification of the first embodiment of the present invention described above, as in the first embodiment, the shielding walls 60A and 60B protruding toward the external space side surround the peripheries of the second openings 52s of the first to third communication holes (communication holes) 521, 522, and 523 to protect the breathable filter 9 from direct hit of high-pressure water or the like and suppress entry of high-pressure water or the like into the second openings 52s of the first to third communication holes (communication holes) 521, 522, and 523. Therefore, it is possible to prevent application of excessive pressure of liquid to the breathable filter 9 and to prevent complete blockage of the first to third communication holes (communication holes) 521, 522 and 523.

In addition, in the electronic control unit 1A according to the first modification of the first embodiment of the present invention, the third wall portion 63A and the fourth wall portion 64A of the shielding wall 60A are each formed in a curved shape protruding in a direction away from the first to third communication holes (communication holes) 521, 522, and 523. According to this configuration, in the curved third wall portion 63A and fourth wall portion 64A, distances from both end portions of the third wall portion 63A and the fourth wall portion 64A to the first to third communication holes (communication holes) 521, 522, and 523 can be shortened as compared with the third wall portion 63 and the fourth wall portion 64 of the first embodiment extending linearly from the first wall portion 61 toward the second wall portion 62, and it is possible to improve shielding performance of the third wall portion 63A and the fourth wall portion 64A with respect to the breathable filter 9.

Furthermore, in the electronic control unit 1A according to the first modification of the first embodiment of the present invention, the third wall portion 63A and the fourth wall portion 64A of the shielding wall 60A are each formed in an arc shape. According to this configuration, distances from both end portions of the third wall portion 63A and the fourth wall portion 64A to the central portion with respect to the first to third communication holes (communication holes) 521, 522, and 523 are substantially equal. Therefore, it is possible to substantially equally secure the shielding performance of the third wall portion 63A and the fourth wall portion 64A with respect to the injection direction of the high-pressure water or the like.

In the electronic control unit 1B according to the second modification of the first embodiment of the present invention, in each of the third wall portion 63B and the fourth wall portion 64B of the shielding wall 60B, the portion located between both end portions connected to the first connector fitting portion 46 and the first connector fitting portion 46 are bent in a direction away from the first to third communication holes (communication holes) 521, 522, and 523. According to this configuration, in the bent third wall portion 63B and fourth wall portion 64B, distances from both end portions of the third wall portion 63B and the fourth wall portion 64B to the first to third communication holes (communication holes) 521, 522, and 523 can be shortened as compared with the third wall portion 63 and the fourth wall portion 64 of the first embodiment extending linearly from the first wall portion 61 toward the second wall portion 62, and it is possible to improve the shielding performance of the third wall portion 63B and the fourth wall portion 64B with respect to the breathable filter 9.

Figure 10:
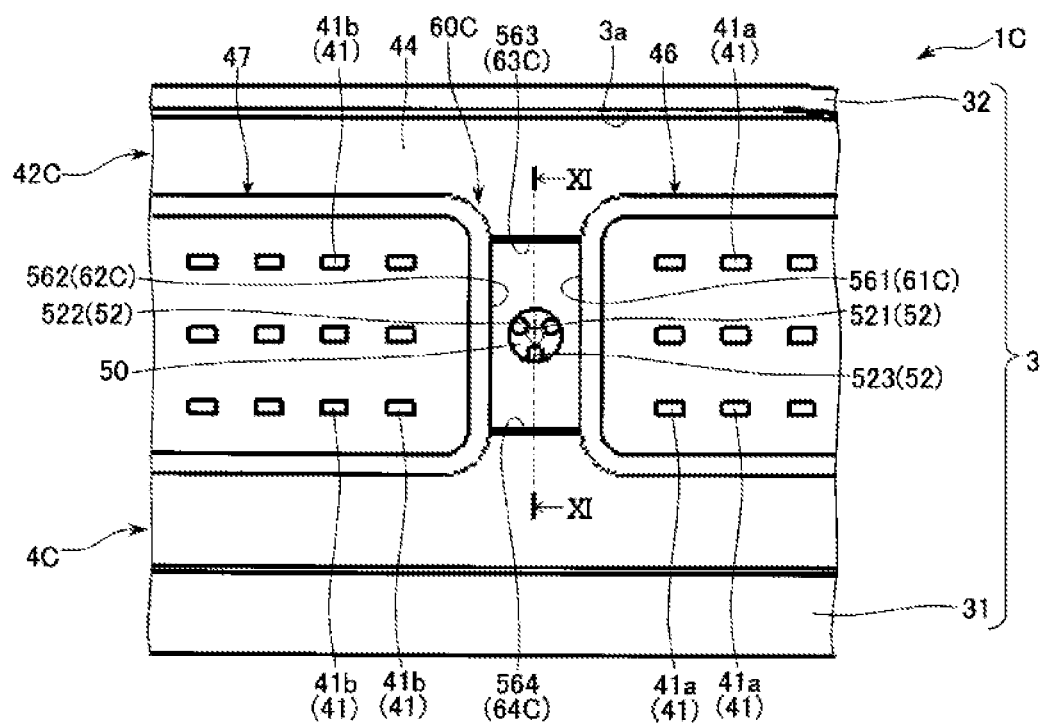
FIG. 10 an enlarged view illustrating a breathing structure and a peripheral structure thereof when an electronic device according to a second embodiment of the present invention is viewed from the connector side.
Figure 11:
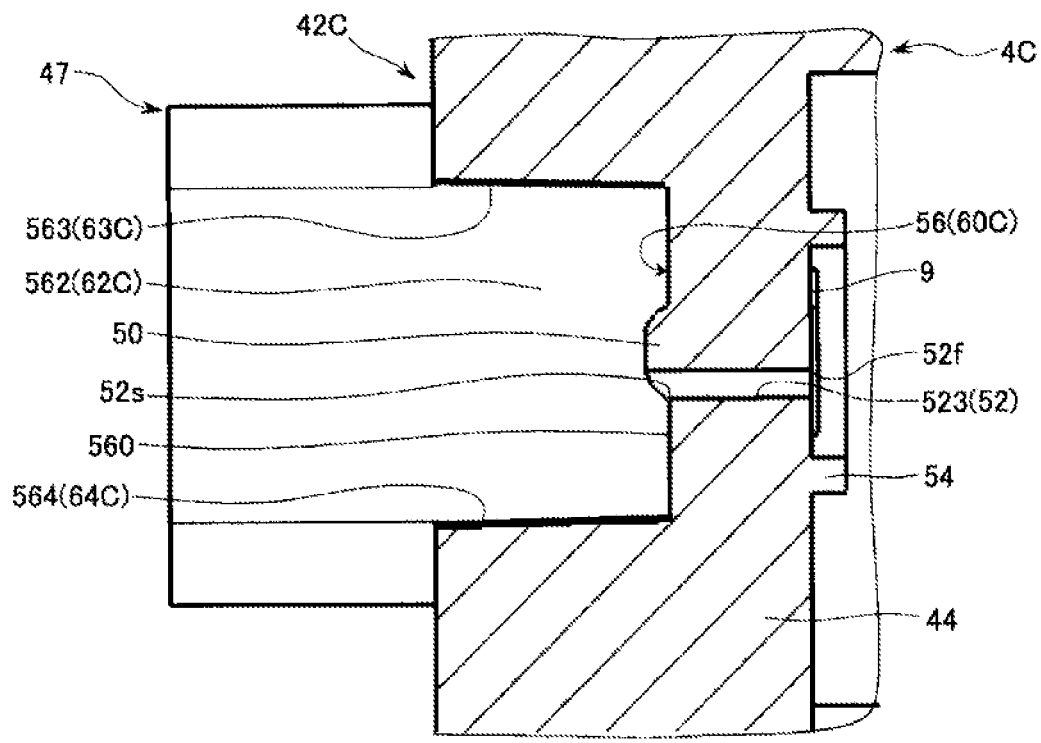
FIG. 11 is a cross-sectional view of the breathing structure in the electronic device according to the second embodiment of the present invention as viewed from arrows XI-XI illustrated in FIG. 10.

Next, an electronic device according to a second embodiment of the present invention will be described with reference to FIGS. 10 and 11. FIG. 10 is an enlarged view illustrating a breathing structure and a peripheral structure thereof when the electronic device according to the second embodiment of the present invention is viewed from the connector side. FIG. 11 is a cross-sectional view of the breathing structure in the electronic device according to the second embodiment of the present invention as viewed from arrows XI-XI illustrated in FIG. 10. In FIGS. 10 and 11, components denoted by the same reference numerals as those illustrated in FIGS. 1 to 9 are similar components, and thus a detailed description thereof will be omitted.

An electronic control unit 1C according to the second embodiment of the present invention illustrated in FIGS. 10 and 11 is different from the electronic control unit 1 according to the first embodiment mainly in that a second opening 52s of a breathing hole group 52 is provided on a bottom surface 560 of a recess 56 provided on an outer surface on an external space side of a housing 3 in a partition wall portion 44 of a connector housing 42C of a connector 4C, and side walls 561, 562, 563, and 564 constituting the recess 56 are caused to function as a shielding wall 60C.

Specifically, in the connector housing 42C, the recess 56 is provided on the outer surface of the partition wall portion 44 located between a first connector fitting portion 46 and a second connector fitting portion 47. For example, the recess 56 has an opening formed in a rectangular shape, and includes the bottom surface 560, a first side wall 561 rising from the bottom surface 560, a second side wall 562 rising from the bottom surface 560 and facing the first side wall 561, a third side wall 563 rising from the bottom surface 560 and connecting one end of the first side wall 561 and one end of the second side wall 562, and a fourth side wall 564 rising from the bottom surface 560 and facing the third side wall 553 and connecting the other end of the first side wall 551 and the other end of the second side wall 562. The first side wall 561 is continuous with the outer surface of the wall portion of the first connector fitting portion 46. The second side wall 562 is continuous with the outer surface of the wall portion of the second connector fitting portion 47.

In a central portion of the bottom surface 560 of the recess 56 of the connector housing 42C, a convex portion 50 in which the second opening 52s of the breathing hole group 52 is opened is disposed. The side wall constituted by the first side wall 561, the second side wall 562, the third side wall 563, and the fourth side wall 564 of the recess 56 has the entire side wall surrounding the convex portion 50 and protruding toward the external space side of the housing 3 from the convex portion 50, and constitutes a shielding wall 60C. That is, the shielding wall 60C of the present embodiment is configured by a first wall portion 61C configured by the first side wall 561 of the recess 56, a second wall portion 620 configured by the second side wall 561 of the recess 56, a third wall portion 630 configured by the third side wall 563 of the recess 56, and a fourth wall portion 64C configured by the fourth side wall 564 of the recess 56. As illustrated in FIG. 11, each of the first side wall 561, the second side wall 562, the third side wall 563, and the fourth side wall 564 of the recess 56 constituting the shielding wall 60C is inclined such that an angle formed with the bottom surface 560 is an obtuse angle.

In the second embodiment of the present invention described above, as in the first embodiment, the shielding wall 60C protruding toward the external space side surrounds the peripheries of the second opening 52s of the first to third communication holes (communication holes) 521, 522, and 523 to protect the breathable filter 9 from a direct hit of high-pressure water or the like, and suppress the entry of high-pressure water or the like into the second opening 52s of the first to third communication holes (communication holes) 521, 522, and 523. Accordingly, it is possible to prevent application of excessive pressure of liquid to the breathable filter 9 and to prevent complete blocking of the first to third communication holes (communication holes) 521, 522, and 523.

In addition, in the electronic control unit 1C according to the present embodiment, the connector housing 42C has the recess 56 provided on the outer surface on the external space side of the housing 3, the first to third communication holes (communication holes) 521, 522, and 523 are formed such that the second opening 52s is positioned on the bottom surface 560 of the recess 56, and the shielding wall 60C is configured by the side walls 561, 562, 563, and 564 of the recess 56. According to this configuration, unlike the shielding wall 60 of the first embodiment, since a thin plate-shaped structure portion is not required as a wall portion of the shielding wall 60C, the shape of the connector housing 42C is simplified, and a portion where the fluidity of the resin during molding of the connector housing 42C is lowered is reduced, and moldability of a product is improved.

Third Embodiment

Figure 12:
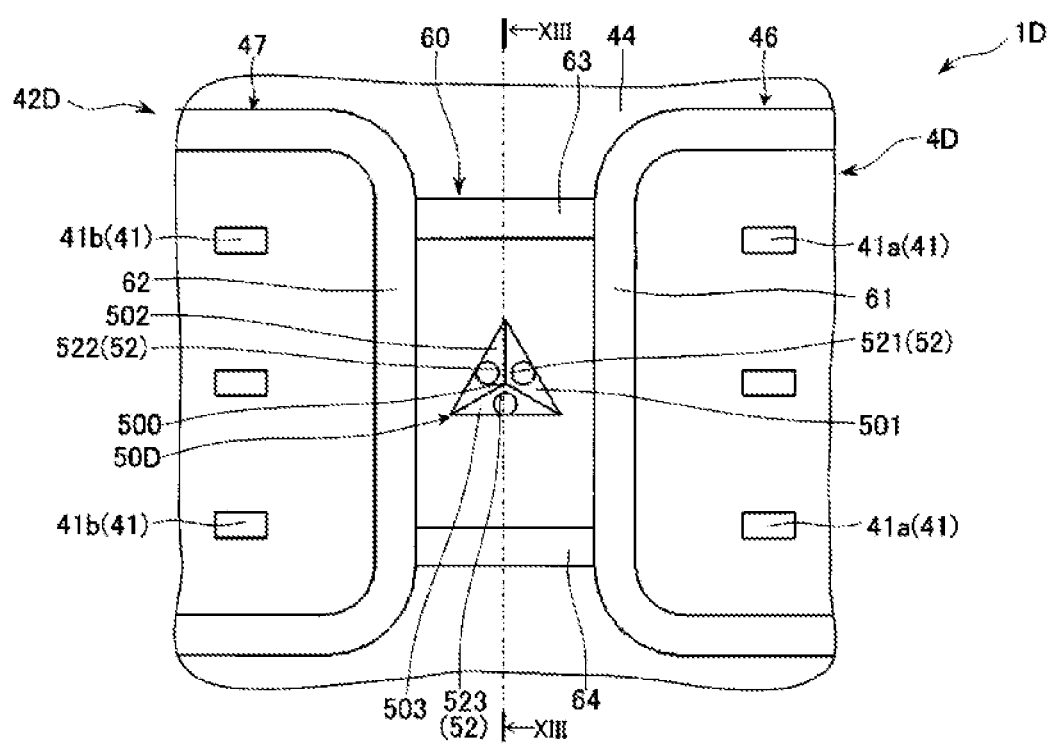
FIG. 12 is an enlarged view illustrating a breathing structure and a peripheral structure thereof when an electronic device according to a third embodiment of the present invention is viewed from a connector side.
Figure 13:
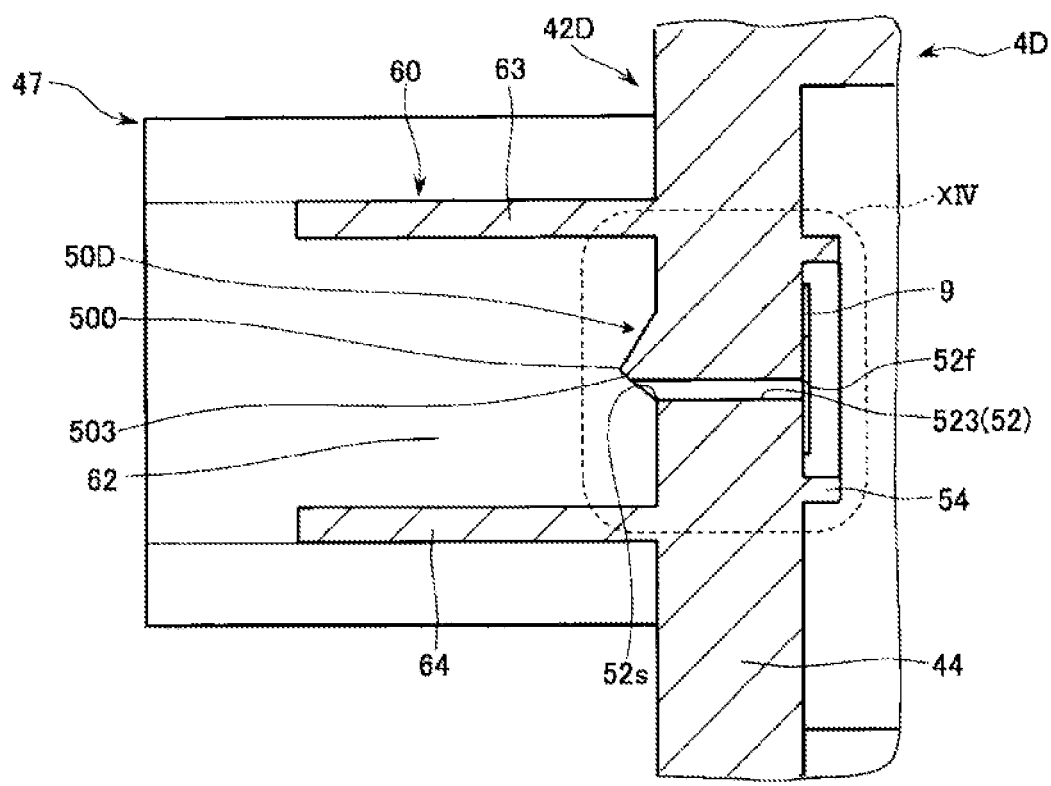
FIG. 13 is a cross-sectional view of the breathing structure in the electronic device according to the third embodiment of the present invention as viewed from arrows XIII-XIII illustrated in FIG. 12.
Figure 14:
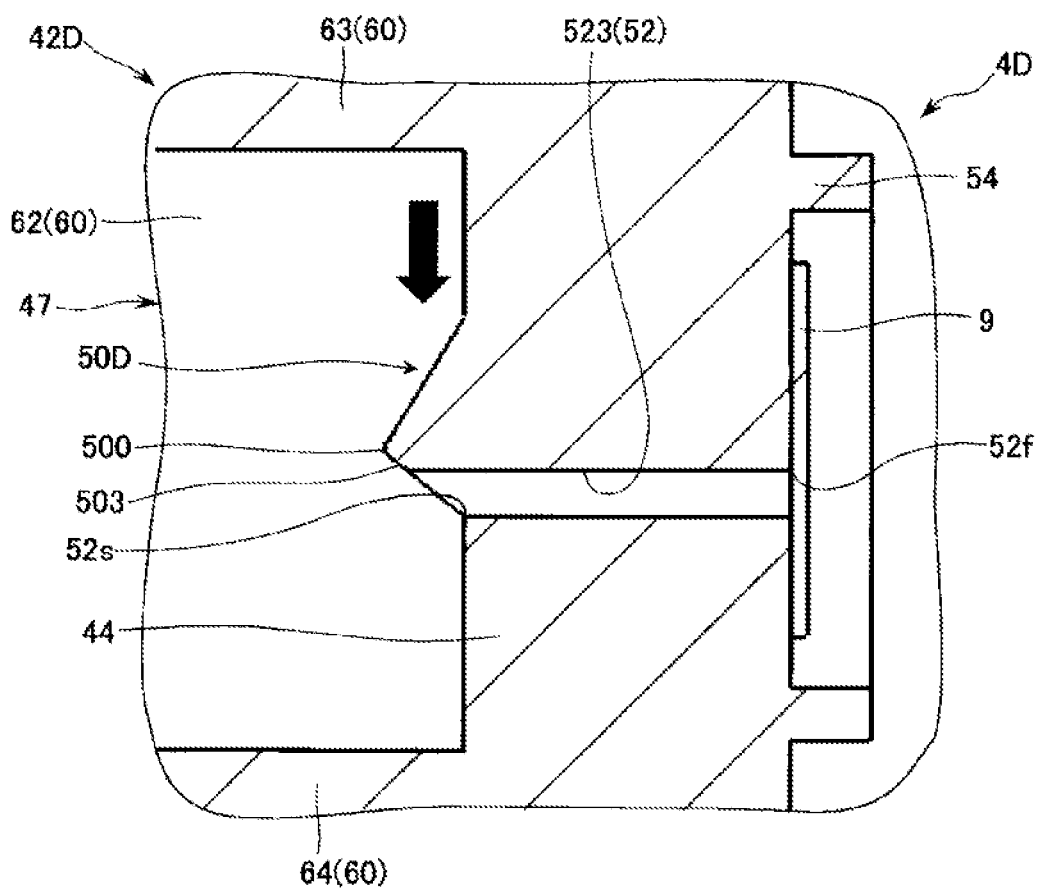
FIG. 14 is a cross-sectional view illustrating the breathing structure of the electronic device according to the third embodiment of the present invention indicated by a reference sign XIV in FIG. 13 in an enlarged state.

Next, an electronic device according to a third embodiment of the present invention will be described with reference to FIGS. 12 to 14. FIG. 12 is an enlarged view illustrating a breathing structure and a peripheral structure thereof when the electronic device according to the third embodiment of the present invention is viewed from the connector side. FIG. 13 is a cross-sectional view of the breathing structure in the electronic device according to the third embodiment of the present invention as viewed from arrows XIII-XIII illustrated in FIG. 12. FIG. 14 is an enlarged cross-sectional view illustrating the breathing structure of the electronic device according to the third embodiment of the present invention denoted by reference numeral XIV in FIG. 13. In FIGS. 12 to 14, components having the same reference numerals as those illustrated in FIGS. 1 to 11 are similar parts, and thus detailed description thereof will be omitted.

An electronic control unit 1D according to the third embodiment of the present invention illustrated in FIGS. 12 and 13 is different from the electronic control unit 1 according to the first embodiment in that a shape of a convex portion 50D provided on an outer surface on an external space side of a housing 3 of a partition wall portion 44 in a connector housing 42D of a connector 4D is different. In the first embodiment, the outer surface of the convex portion 50 has a curved surface (spherical surface) having a constant curvature (refer to FIG. 5). Meanwhile, in the third embodiment, as illustrated in FIGS. 12 and 13, the convex portion 50D is formed in a triangular pyramid shape. The triangular pyramid-shaped convex portion 50D has an apex 500 at a central portion, and an outer surface thereof is constituted by three surfaces 501, 502, and 503 sharing the apex 500. A first communication hole 521, a second communication hole 522, and a third communication hole 523 are formed such that a second opening 52s is positioned on a first surface 501, a second surface 502, and a third surface 503, which are three surfaces constituting the outer surface of the convex portion 50D. That is, the second openings 52s of the first communication hole 521, the second communication hole 522, and the third communication hole 523 are formed at the peripheral edge portion of the apex 500 of the convex portion 50D.

In the present embodiment, as illustrated in FIG. 14, the second openings 52s of three first to third communication holes 521, 522, and 523 are positioned on three surfaces 501, 502, and 503 of triangular pyramid-shaped convex portion 50D protruding toward the external space side of housing 3. In this case, when the liquid flowing down on the outer surface of the connector housing 42D flows along the surface of the convex portion 50D, entry of the liquid into the third communication hole 523 located below the apex 500 of the convex portion 50D among the three first to third communication holes 521, 522, and 523 is suppressed. Therefore, it is possible to prevent the three first to third communication holes 521, 522, and 523 from being simultaneously closed.

In the electronic control unit 1D according to the third embodiment of the present invention described above, the convex portion 50D is formed to have a triangular pyramid shape, and the first to third communication holes (communication holes) 521, 522, and 523 are formed such that the second opening 52s is located on the three surfaces 501, 502, and 503 constituting the outer surface of the convex portion 50D. According to this configuration, the inclination of the three surfaces 501, 502, and 503 constituting the outer surface of the convex portion 50D is larger than the inclination of the surface of the convex portion 50 of the first embodiment. Therefore, as compared with the case of the convex portion 50 of the first embodiment, it is difficult for liquid flowing along the surface of the convex portion 50D to enter the third communication hole 523 located below the apex 500 of the convex portion 50D. It is possible to more reliably prevent the three first to third communication holes (communication holes) 521, 522, and 523 from being simultaneously closed.

Fourth Embodiment

Figure 15:
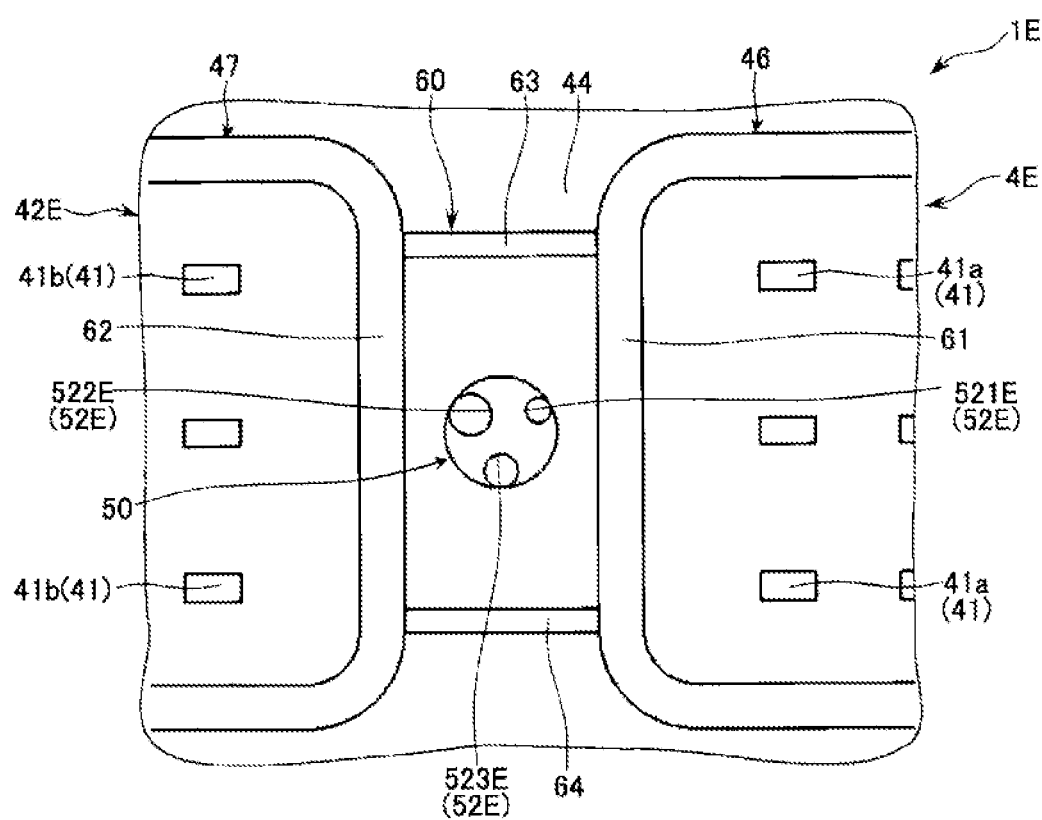
FIG. 15 is an enlarged view illustrating a breathing structure and a peripheral structure thereof when an electronic device according to a fourth embodiment of the present invention is viewed from the connector side.

Next, an electronic device according to a fourth embodiment of the present invention will be described with reference to FIG. 15. FIG. 15 is an enlarged view illustrating a breathing structure and a peripheral structure thereof when the electronic device according to the fourth embodiment of the present invention is viewed from the connector side. In FIG. 15, components denoted by the same reference numerals as those illustrated in FIGS. 1 to 14 are similar components, and thus a detailed description thereof will be omitted.

While the electronic control unit 1 according to the first embodiment is configured such that the hole diameters of the three first communication holes 521, second communication holes 522, and third communication holes 523 in the connector housing 42 of the connector 4 are all the same, in an electronic control unit 1E according to the fourth embodiment of the present invention illustrated in FIG. 15, the hole diameters of three first communication holes 521E, second communication holes 522E, and third communication holes 523E in the connector housing 42E of a connector 4E are all different. For example, the second communication hole 522E, the third communication hole 523E, and the first communication hole 521E have smaller hole diameters in this order.

In the electronic control unit according to the fourth embodiment of the present invention described above, the at least three first to third communication holes 521E, 522E, and 523E are formed to have different hole diameters. According to this configuration, when second openings 52s of the first to third communication holes 521E, 522E, and 523E are sprinkled with water, the communication hole 522E having a larger hole diameter more easily pulls moisture by the surface tension generated at the opening edge of the second opening 52s than the other communication holes 521E, 523E, and accordingly, opening states of the communication holes 521E and 523E having smaller hole diameters are easily maintained. Therefore, the possibility that the first to third communication holes 521E, 522E, and 523E are simultaneously closed can be reduced.

Modification of Fourth Embodiment

Figure 16:
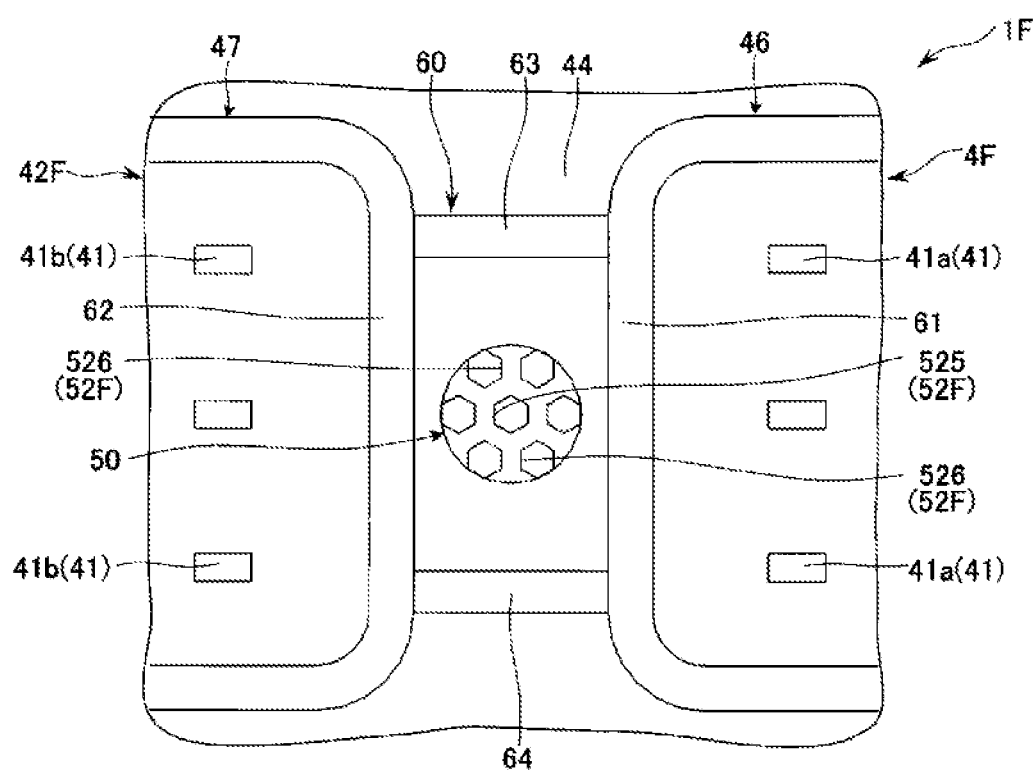
FIG. 16 is an enlarged view illustrating a breathing structure and a peripheral structure thereof when an electronic device according to a modification of the fourth embodiment of the present invention is viewed from a connector side.

Next, an electronic device according to a modification of the fourth embodiment of the present invention will be described with reference to FIG. 16. FIG. 16 is an enlarged view illustrating a breathing structure and a peripheral structure thereof when the electronic device according to the modification of the fourth embodiment of the present invention is viewed from a connector side. In FIG. 16, components denoted by the same reference numerals as those illustrated in FIGS. 1 to 15 are similar components, and thus a detailed description thereof will be omitted.

An electronic control unit 1F according to the modification of the fourth embodiment of the present invention illustrated in FIG. 16 is different from the electronic control unit 1 according to the first embodiment in the number of holes and the shape of a breathing hole group 52F in a connector housing 42F of connector 4F. In the first embodiment, the breathing hole group 52 includes the three first communication holes 521, second communication holes 522, and third communication holes 523 each having a circular outline. Meanwhile, in the present modification, the breathing hole group 52F includes seven communication holes 525 and 526 each having a regular hexagonal outline shape. Specifically, the breathing hole group 52F include a central communication hole 525 in which a second opening 52s is formed at a position of a central portion (top portion) of a convex portion 50 of a connector housing 42, and six peripheral edge communication holes 526 in which the second opening 52s is formed at a position of a peripheral edge portion of the convex portion 50. The peripheral edge communication holes 526 are arranged at equal intervals (intervals at a central an of 60° around the central portion of the convex portion 50) along the outer periphery of the peripheral edge portion of the convex portion 50.

In the electronic control unit 1F according to the modification of the fourth embodiment of the present invention described above, the breathing hole group 52F includes seven communication holes 525 and 526. According to this configuration, as compared with the case of the fourth embodiment including the breathing hole group 52E including the three communication holes 521E, 522E, and 523E, the possibility that the seven communication holes 525 and 526 are simultaneously blocked can be reduced, and the resistance at the time of passage of the liquid through the communication holes 525 and 526 can increase while securing the necessary air flow rate of the breathing hole group 52F. Therefore, it is possible to prevent application of excessive pressure to the breathable filter 9 and to prevent simultaneous occlusion of all the seven communication holes 525 and 526.

Further, in the electronic control unit according to the present modification, all of the seven communication holes 525 and 526 are formed so as to have a hexagonal outline shape. According to this configuration, it is possible to increase the number of holes that can be arranged in the same area as compared with the case of the communication hole having a circular contour shape, Therefore, it is possible to sufficiently secure the air flow rates of all the communication holes 525 and 526.

Fifth Embodiment

Figure 17:
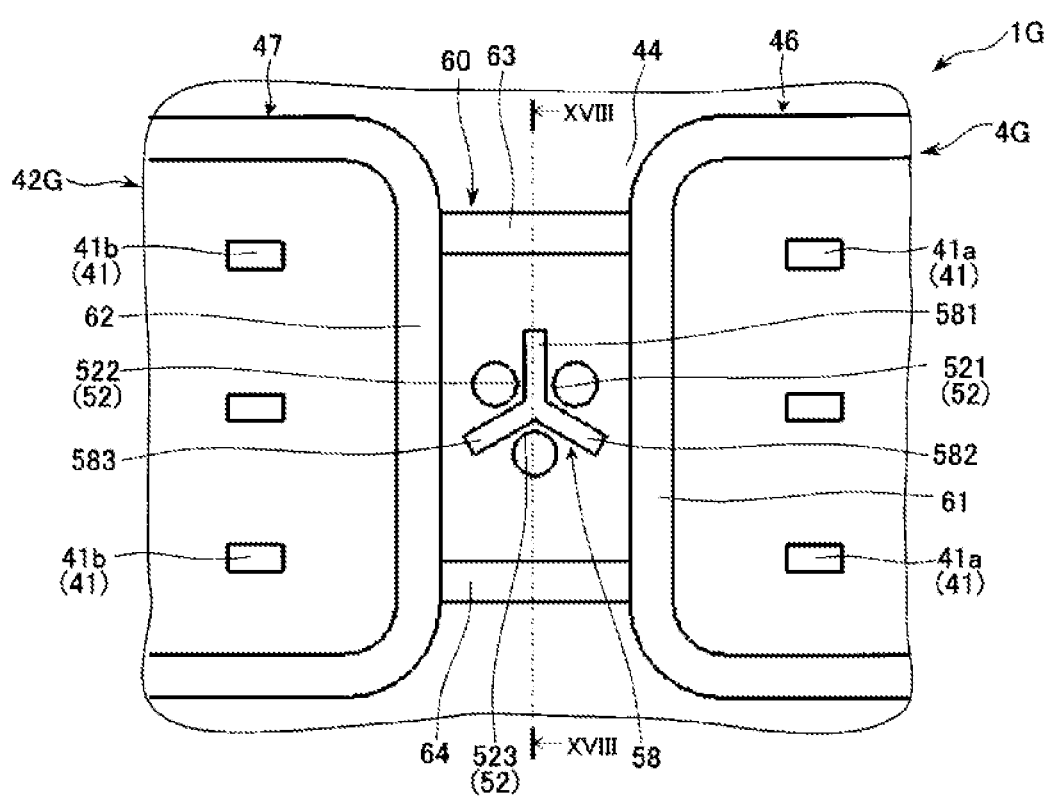
FIG. 17 is an enlarged view illustrating a breathing structure and a peripheral structure thereof when an electronic device according to a fifth embodiment of the present invention is viewed from a connector side.
Figure 18:
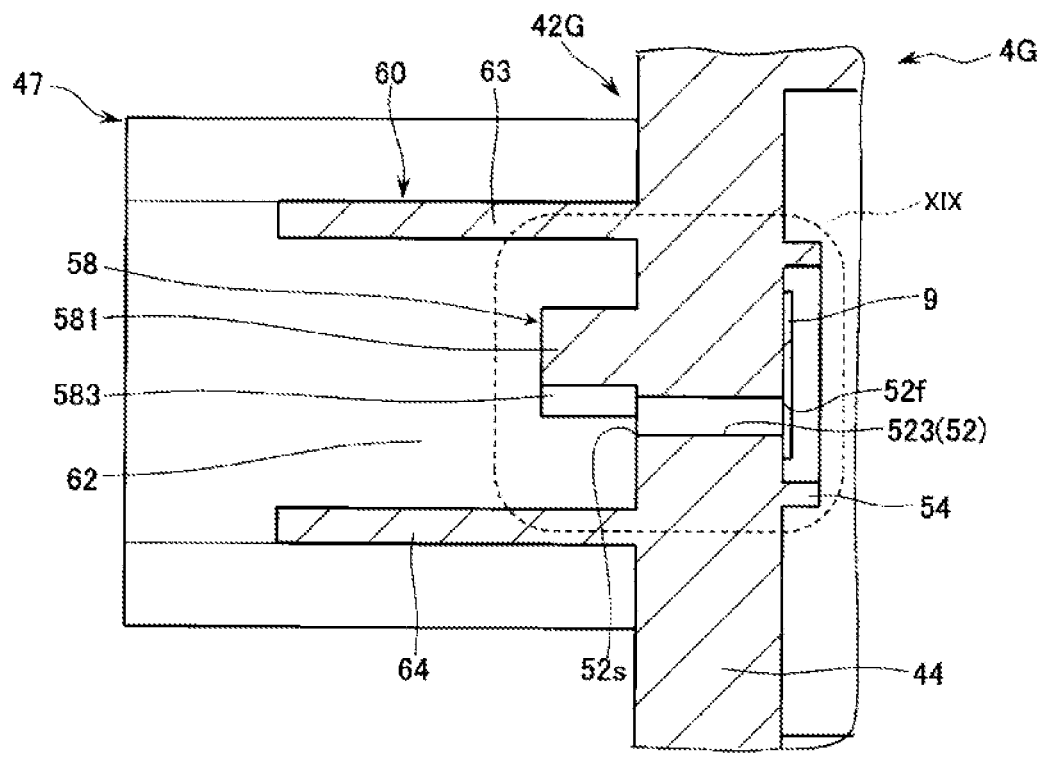
FIG. 18 is a cross-sectional view of the breathing structure in the electronic device according to the fifth embodiment of the present invention as viewed from arrows XVIII XVIII illustrated in FIG. 17.
Figure 19:
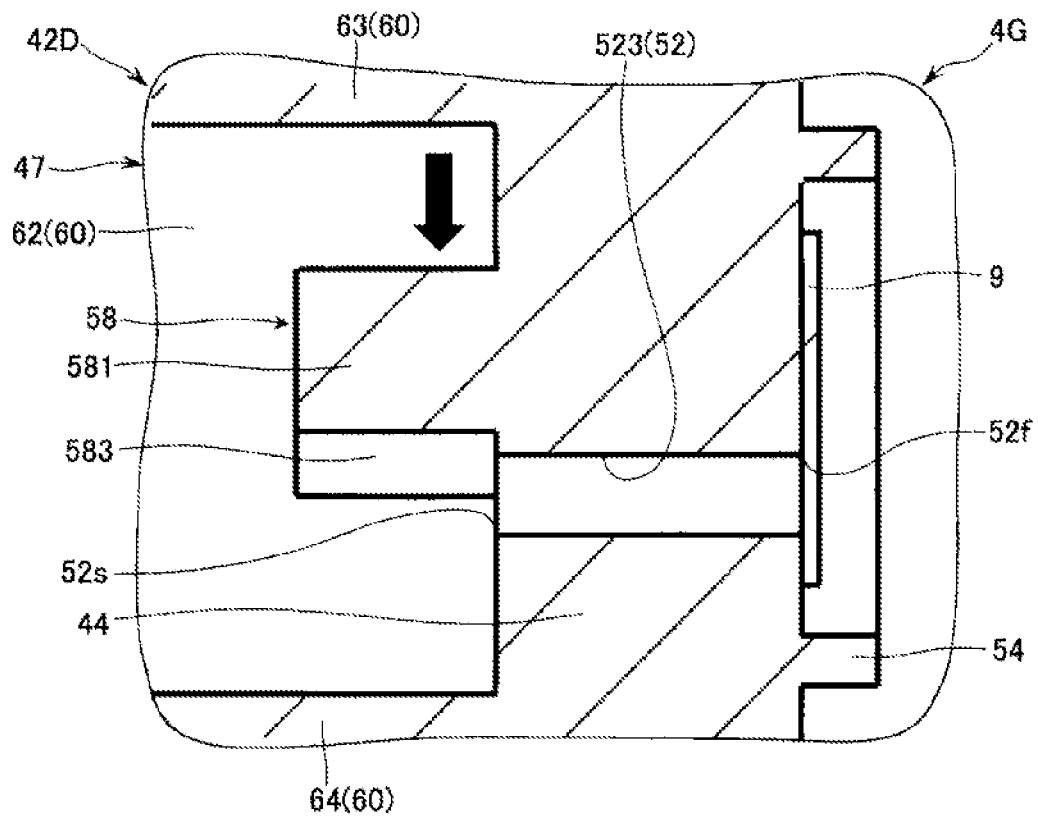
FIG. 19 is a cross-sectional view illustrating the breathing structure of the electronic device according to the fifth embodiment of the present invention indicated by a reference numeral XIX in FIG. 18 in an enlarged state.

Next, an electronic device according to a fifth embodiment of the present invention will be described with reference to FIGS. 17 to 19. FIG. 17 is an enlarged view illustrating a breathing structure and a peripheral structure thereof when the electronic device according to the fifth embodiment of the present invention is viewed from the connector side. FIG. 18 is a cross-sectional view of the breathing structure in the electronic device according to the fifth embodiment of the present invention as viewed from arrows XVIII-XVIII illustrated in FIG. 17. FIG. 19 is an explanatory diagram illustrating an operation of the breathing structure of the electronic device according to the fifth embodiment of the present invention. In FIGS. 17 to 19, components having the same reference numerals as those illustrated in FIGS. 1 to 16 are similar parts, and thus detailed description thereof will be omitted.

An electronic control unit 1G according to the fifth embodiment of the present invention illustrated in FIGS. 17 and 18 is different from the electronic control unit 1 according to the first embodiment in that a connector housing 42G of a connector 4G has a partition wall portion 58 instead of the convex portion 50. Specifically, on an outer surface of a partition wall portion 44 of connector housing 42G, a partition wall portion 58 protruding toward an external space side of a housing 3 is provided at a position between adjacent second openings 52s of first to third communication holes 521, 522, and 523 of a breathing hole group 52. The partition wall portion 55 includes a first partition portion 581 positioned between the second openings 52s of the first communication hole 521 and the second communication hole 522, a second partition portion 582 positioned between the second openings 52s of the first communication hole 521 and the third communication hole 523, and a third partition portion 583 positioned between the second openings 52s of the second communication hole 522 and the third communication hole 523. One end of the first partition portion 581, one end of the second partition portion 582, and one end of the third partition portion 583 are connected to each other, and thus, the partition wall portion 58 is formed in a Y shape. The other end of the first partition portion 581, the other end of the second partition portion 582, and the other end of the third partition portion 583 are configured to have a gap from a shielding wall 60.

In the electronic control unit 10 according to the above-described fifth embodiment of the present invention, the connector housing 42G is configured to have the partition wall portion 58 protruding toward the external space side of the housing 3 at a position between the adjacent communication holes of at least three first to third communication holes 521, 522, and 523. According to this configuration, as illustrated in FIGS. 17 and 19, a flow path through which the liquid flowing down on the outer surface of the partition wall portion 44 of the connector housing 42G flows toward the three first to third communication holes 521, 522, and 523 is divided by the partition wall portion 58. Therefore, even when the liquid flows down on the outer surface of the partition wall portion 44, any one of the three first to third communication holes (communication holes) 521, 522, and 523 can be maintained in the open state. Therefore, it is possible to reliably prevent simultaneous blockage of the three first to third communication holes (communication holes) 521, 522, and 523 and maintain the pressure adjustment function of the breathable filter 9.

First Modification of Fifth Embodiment

Figure 20:
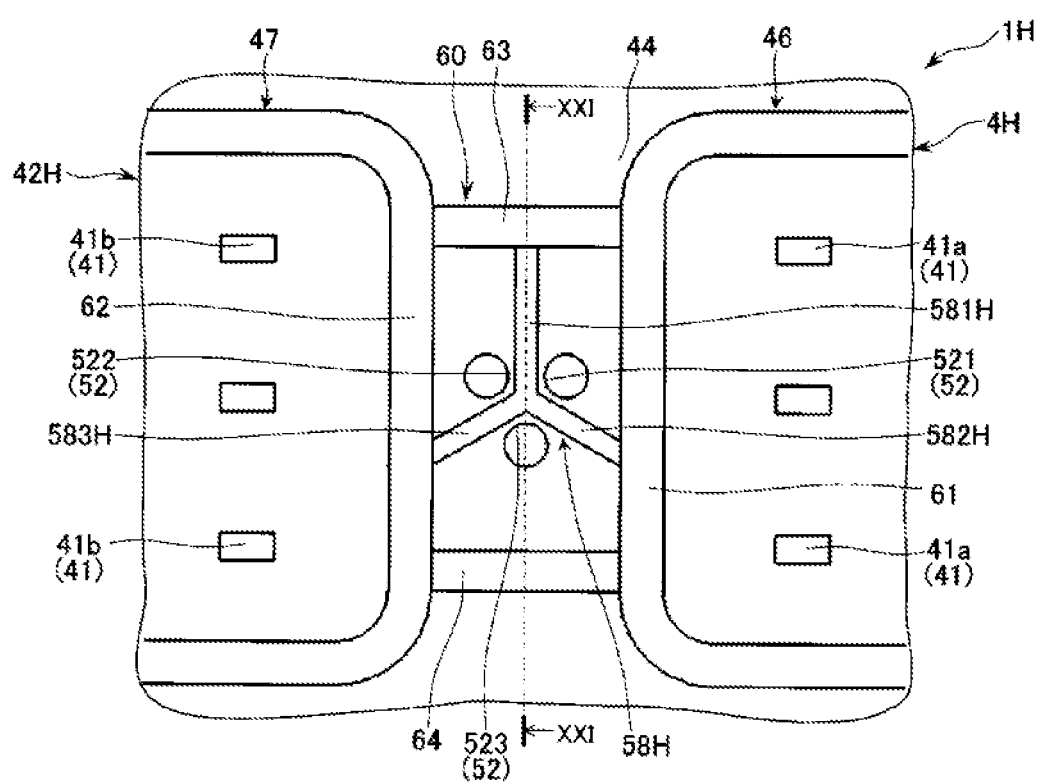
FIG. 20 is an enlarged view illustrating a breathing structure and a peripheral structure thereof when an electronic device according to a first modification of the fifth embodiment of the present invention is viewed from a connector side.
Figure 21:
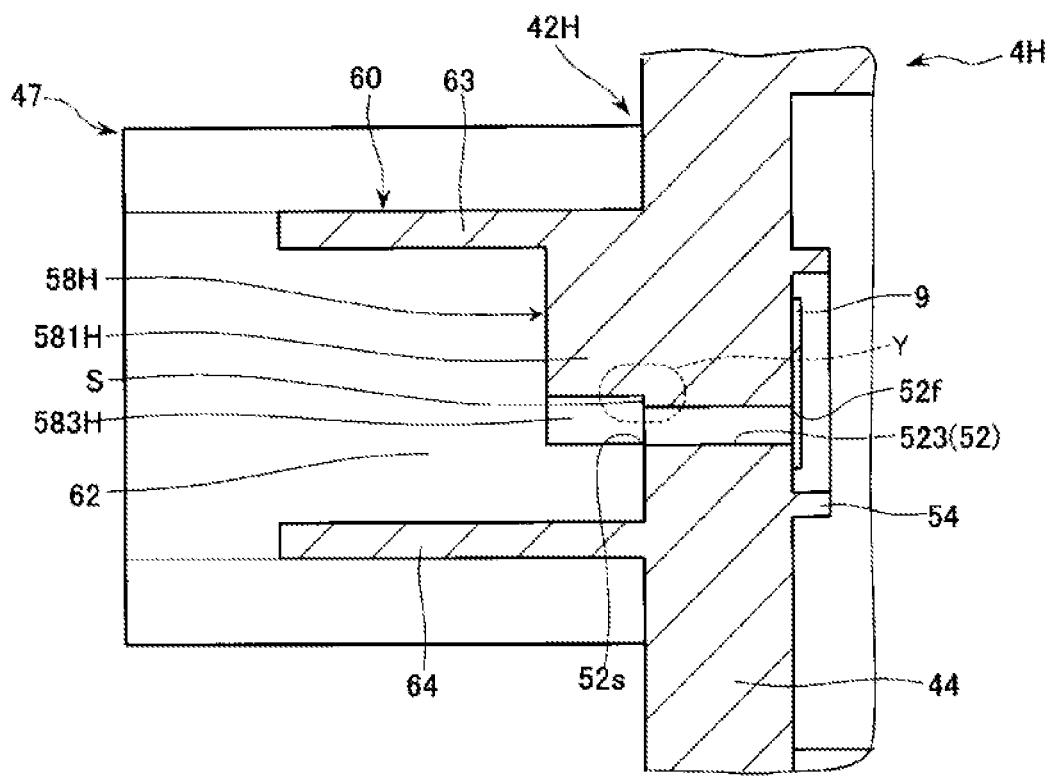
FIG. 21 is a cross-sectional view of the breathing structure in an electronic device according to a first modification of the fifth embodiment of the present invention as viewed from arrows XXI-XXI illustrated in FIG. 20.

Next, an electronic device according to a first modification of the fifth embodiment of the present invention will be described with reference to FIGS. 20 and 21. FIG. 20 is an enlarged view illustrating a breathing structure and a peripheral structure thereof when the electronic device according to the first modification of the fifth embodiment of the present invention is viewed from a connector side. FIG. 21 is a cross-sectional view of the breathing structure in the electronic device according to the first modification of the fifth embodiment of the present invention as viewed from arrows XXI-XXI illustrated in FIG. 20. In FIGS. 20 and 21, components denoted by the same reference numerals as those illustrated in FIGS. 1 to 19 are similar parts, and thus a detailed description thereof will be omitted.

An electronic control unit 1H according to the first modification of the fifth embodiment of the present invention illustrated in FIGS. 20 and 21 is different from the electronic control unit 1G according to the fifth embodiment in that a partition wall portion 58H in a connector housing 42H of connector 4H is configured to be connected to a shielding wall 60. Specifically, one end of a first partition portion 581H of the partition wall portion 58H is connected to a second partition portion 582H and a third partition portion 583H, and the other end is connected to a third wall portion 63 of the shielding wall 60. One end of the second partition portion 582H is connected to the first partition portion 581H and the third partition portion 583H, and the other end is connected to a wall portion of a first connector fitting portion 45 constituting a first wall portion 61 of the shielding wall 60. One end of the third partition portion 583H is connected to the second partition portion 582H and the third partition portion 583H, and the other end is connected to a wall portion of a second connector fitting portion 47 constituting a second wall portion 62 of the shielding wall 60. That is, the inside of the shielding wall 60 is divided by the partition wall portion 58H into three spaces of a space where a first communication hole 521 is located, a space where a second communication hole 522 is located, and a space where a third communication hole 523 is located.

In the first modification of the fifth embodiment described above, similarly to the fifth embodiment, since the flow path through which the liquid flowing down on the outer surface of the partition wall portion 44 of the connector housing 42H flows toward the three first to third communication holes 521, 522, and 523 is divided by the partition wall portion 58H, it is possible to reliably prevent simultaneous blockage of the three first to third communication holes (communication holes) 521, 522, and 523 and maintain the pressure adjustment function of the breathable filter 9.

In addition, in the electronic control unit 1H according to the present modification, the partition wall portion 58H is formed to be connected to the shielding wall 60. According to this configuration, portions of the mold of the connector housing 42H corresponding to the partition wall portion 58H and the shielding wall 60 have a continuous shape. When the mold has a continuous shape, fluidity of a resin is higher than when the mold has a divided shape. Therefore, since the fluidity of the resin in the mold of the connector housing 42H is higher than in the case of the fifth embodiment in which the partition wall portion 58 and the shielding wall 60 have a divided shape, the moldability of the connector housing 42H is improved accordingly.

Second Modification of Fifth Embodiment

Figure 22:
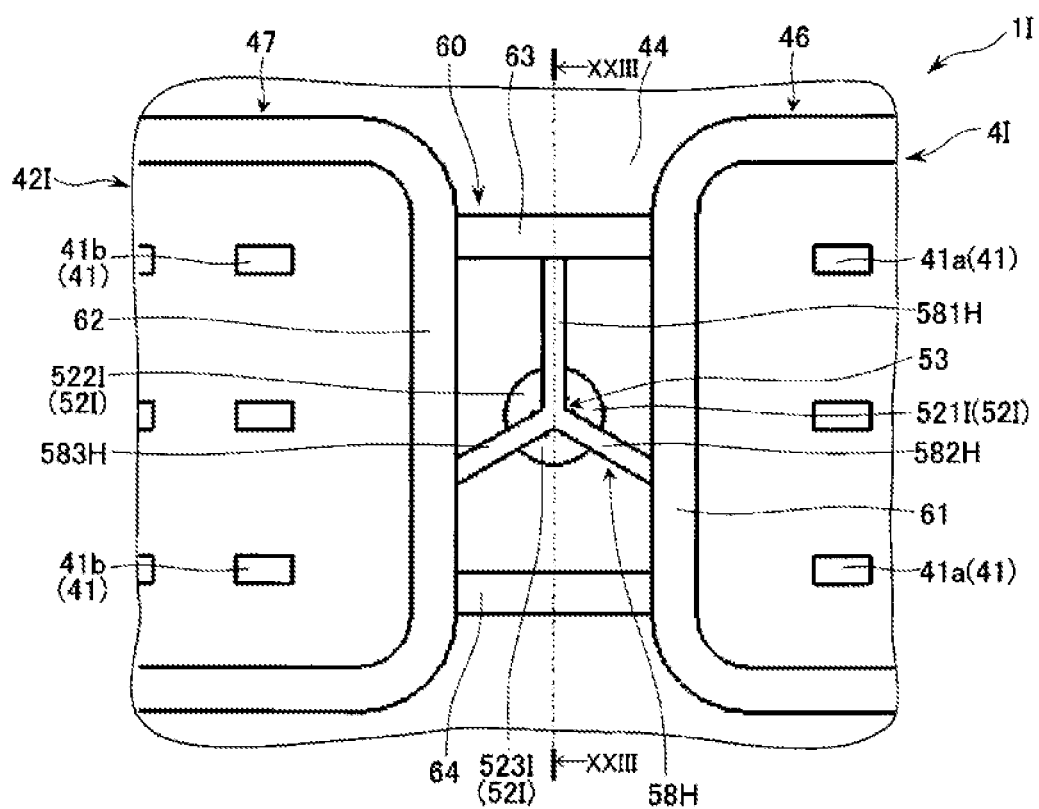
FIG. 22 is an enlarged view illustrating a breathing structure and a peripheral structure thereof when an electronic device according to a second modification of the fifth embodiment of the present invention is viewed from a connector side.
Figure 23:
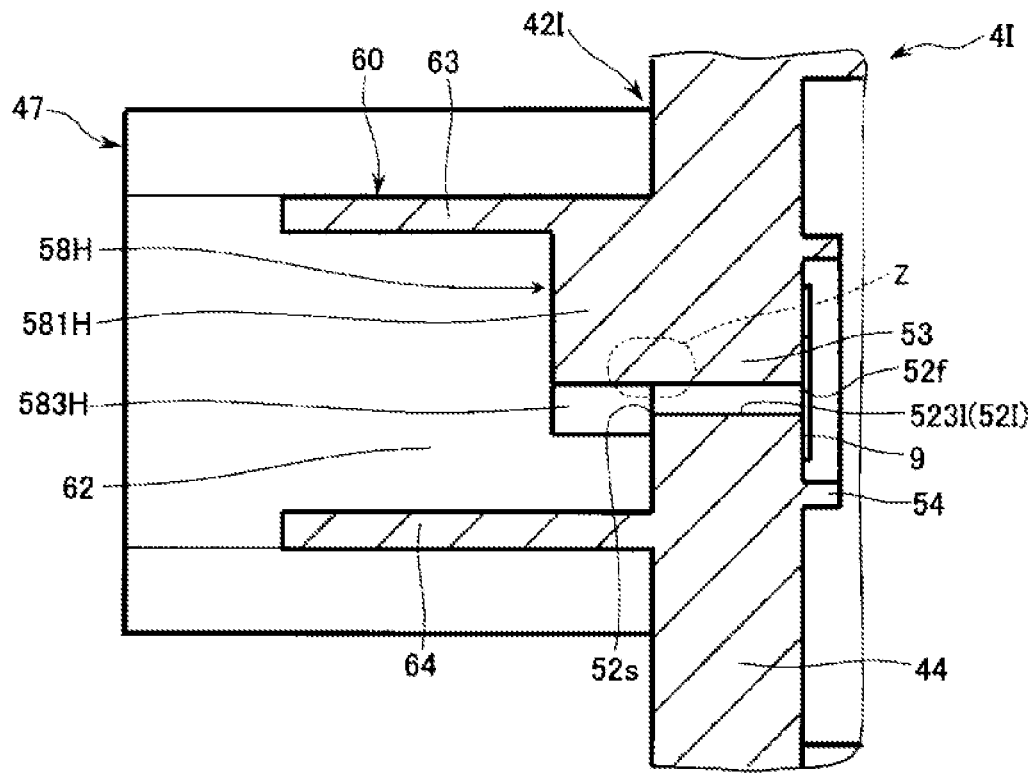
FIG. 23 is a cross-sectional view of a breathing structure in an electronic device according to a second modification of the fifth embodiment of the present invention as viewed from arrows XXIII-XXIII illustrated in FIG. 22.

Next, an electronic device according to a second modification of the fifth embodiment of the present invention will be described with reference to FIGS. 22 and 23. FIG. 22 is an enlarged view illustrating a breathing structure and a peripheral structure thereof when the electronic device according to the second modification of the fifth embodiment of the present invention is viewed from the connector side. FIG. 23 is a cross-sectional view of the breathing structure in the electronic device according to the second modification of the fifth embodiment of the present invention as viewed from arrows XXIII-XXIII illustrated in FIG. 22. In FIGS. 22 and 23, components denoted by the same reference numerals as those illustrated in FIGS. 1 to 21 are similar parts, and thus a detailed description thereof will be omitted.

An electronic control unit 1I according to the second modification of the fifth embodiment of the present invention illustrated in FIGS. 22 and 23 is different from the electronic control unit 1H according to the first modification of the fifth embodiment in that a connector housing 42I of a connector 4I has a separation inner wall portion 53 constituting a hole inner wall that separates a first communication hole 521I, a second communication hole 522I, and a third communication hole 523I of a breathing hole group 52I from each other, and the separation inner wall portion 53 and a partition wall portion 58H are connected so as to be continuous. Specifically, the three first communication holes 521I, the second communication holes 522I, and the third communication holes 523I of the breathing hole group 52I are formed in a shape in which one round hole is separated by the separation inner wall portion 53 having a trifurcated cross section. That is, the separation inner wall portion 53 separates the adjacent communication holes of the three first communication holes 521I, the second communication holes 522I, and the third communication holes 523I from each other, and constitutes a part of the inner wall of each communication hole. The separation inner wall portion 53 is configured to be continuous with the base end of the partition wall portion 58H at a position of a second opening 52s and have the same cross-sectional shape as the central portion of the cross-sectional shape of the partition wall portion 58H.

In the first modification of the fifth embodiment, since the portions constituting the inner walls of the three first communication holes 521, the second communication holes 522, and the third communication holes 523 are not continuous with the partition wall portion 58H, a small step surface S (the outer surface of the partition wall portion 44 of the connector housing 42H) remains between the partition wall portion 58H and the second opening 52s of the breathing hole group 52 as denoted by reference sign Y in FIG. 21. The step surface S is a small region formed between the protruding portion and the hole opening portion, and has a shape that requires time and effort to manufacture the mold.

Meanwhile, in the first modification of the fifth embodiment, at the positions of the second openings 52s of the three first communication hole 521I, second communication hole 522I, and the third communication hole 523I, since the separation inner wall portion 53 of the breathing hole group 52I continues to the partition wall portion 58H with the original cross-sectional shape, a small step surface is not generated between the partition wall portion 58H and the second opening 52s of the breathing hole group 52I (first communication hole 521I, second communication hole 522I, third communication hole 523I) as indicated by reference sign Z in FIG. 23. Therefore, in the present modification, it is easier to manufacture the mold of the connector housing 42I than in the case of the configuration of the first modification of the fifth embodiment.

In the electronic control unit 1I according to the second modification of the fifth embodiment described above, the connector housing 42I has the separation inner wall portion 53 that separates the at least three communication holes 521I, 522I, and 523I from each other to constitute a part of the inner wall of the at least three communication holes 521I, 522I, and 523I, and the separation inner wall portion 53 is continuous to the base end of the partition wall portion 58H at the position of the second opening 52s and is configured such that the cross-sectional shape thereof is the same as at least a part of the cross-sectional shape of the partition wall portion 58H. According to this configuration, a small step surface is not formed between the second openings 52s of the first communication hole 521I, the second communication hole 522I, and the third communication hole 523I and the partition wall portion 58H, and thus, the shape of the mold is simplified accordingly.

Other Embodiments

Note that the present invention is not limited to the above-described embodiments, and includes various modifications. The above-described embodiments have been described in detail for easy understanding of the present invention, and are not necessarily limited to those having all the described configurations. A part of the configuration of an embodiment can be replaced with the configuration of another embodiment, and the configuration of another embodiment can be added to the configuration of an embodiment. In addition, it is also possible to add, delete, and replace other configurations for a part of the configuration of each embodiment.

For example, in the first embodiment to the second modification of the fifth embodiment described above, the example in which the connector hosing includes the breathing hole group including three communication holes and the shielding wall has been described. However, when the connector housing includes a shielding wall, the breathing hole group can be formed of one communication hole. Since the shielding wall can prevent a direct hit of the high-pressure water against the breathable filter 9, the necessity of increasing the fluid resistance by the plurality of communication holes is reduced. In addition, in a case where the breathing hole group includes three or more communication holes, a configuration in which the connector housing does not include a shielding wall is also possible. By increasing the fluid resistance with three or more communication hole it is possible to avoid the application of excessive pressure to the breathable filter 9, and thus, the necessity of blocking the high-pressure water by the shielding wall is reduced.

Furthermore, in the first embodiment described above, the example has been illustrated in which all the inner surfaces 631 and 641 of the first wall portion 61, the second wall portion 62, the third wall portion 63, and the fourth wall portion 64 of the shielding wall 60 are configured to e gradually inclined toward the sides of the outer surfaces 632 and 642 of the shielding wall 60 from the base side toward the tip side. However, it is also possible to configure such that only the inner surface of the wall portion of the shielding wall 60 positioned on the lower side (ground side) is inclined when the electronic control unit 1 is attached. Even in this case, it is possible to ensure improvement in drainage of the liquid that has entered the shielding wall.

REFERENCE SIGNS LIST 1, 1A, 1B, 1C, 1D, 1E, 1F, 1G, 1H, 1I electronic control unit (electronic device)
2 circuit board.
2a electronic component
3 housing
3a opening portion
4, 4A, 4B, 4C, 4D, 4E, 4F, 4G, 4H, 4I connector
9 breathable filter (filter)
41 connection terminal
42, 42A, 42B, 42C, 42D, 42E, 42F, 42G, 42H, 42I connector housing
46 first connector fitting portion (connector fitting portion)
47 second connector fitting portion (connector fitting portion)
48 third connector fitting portion (connector fitting portion)
50, 50D convex portion
52f first opening
52s second opening
521, 521E, 521I first communication hole (communication hole)
522, 522E, 522I second communication hole (communication hole)
523, 523E, 523I third communication hole (communication hole)
525 central communication hole (communication hole)
526 peripheral edge communication hole (communication hole)
53 separation inner wall portion
56 recess
560 bottom surface
561 first side wall (side wall)
562 second side wall (side wall)
563 third side wall (side wall)
564 fourth side wall (side wall)
58, 58H partition wall portion
60, 60A, 60B, 60C shielding wall
61 first wall portion
62 second wall portion
63, 63A, 63B third wall portion
631 inner surface
632 outer surface
64, 64A, 64B fourth wall portion
641 inner surface
642 outer surface
101 first external connector (external connector)
102 second external connector (external connector)
103 third external connector (external connector)

The invention claimed is:

1. An electronic device comprising:
a circuit board on which an electronic component is mounted;
a housing that has an opening portion and accommodates the circuit board;
a connector that includes a connection terminal that enables electrical connection of the circuit board to an external connector, and a connector housing that holds the connection terminal and closes the opening portion of the housing, and has a communication hole that penetrates the connector housing and allows an internal space and an external space of the housing to communicate with each other; and
a filter which is attached to the connector housing so as to cover a first opening of the communication hole, the first opening being open to an internal space side of the housing and through which air passes,
wherein the connector housing includes a shielding wall that surrounds a periphery of a second opening of the communication hole, the second opening being open to an external space side of the housing, and protrudes toward the external space side of the housing from the second opening of the communication hole,
wherein the connector housing includes a plurality of connector fitting portions that have tubular shape, protrude toward an external space side of the housing, and is fitted to the external connector,
the connector fitting portions are disposed at intervals from each other, and
the communication hole is formed such that the second opening is positioned between a first connector fitting portion that is one of the connector fitting portions and a second connector fitting portion adjacent to the first connector fitting portion,
wherein the shielding wall includes a first wall portion, a second wall portion provided at a position facing the first wall portion, a third wall portion connecting the first wall portion and the second wall portion, and a fourth wall portion provided on a side opposite to the third wall portion across a position of the communication hole and connecting the first wall portion and the second wall portion,
the first wall portion is configured by a part of the first connector fitting portion, and
the second wall portion is configured by a part of the second connector fitting portion,
wherein in each of the third wall portion and the fourth wall portion, a portion located between both end portions connected to the first connector fitting portion and the second connector fitting portion is bent in a direction away from the communication hole.

2. The electronic device according to claim 1,
wherein each of the third wall portion and the fourth wall portion is formed in a curved shape protruding in a direction away from the communication hole.

3. The electronic device according to claim 1,
wherein the shielding wall includes a first wall portion, a second wall portion provided at a position facing the first wall portion, a third wall portion connecting the first wall portion and the second wall portion, and a fourth wall portion provided on a side opposite to the third wall portion across a position of the communication hole and connecting the first wall portion and the second wall portion, and
the shielding wall is configured such that an inner surface of at least one of the first wall portion, the second wall portion, the third wall portion, and the fourth wall portion gradually inclines toward an outer surface side of the shielding wall from a base side toward a tip side.

4. The electronic device according to claim 1,
wherein the connector housing has a recess provided in an outer surface of the housing on an external space side, and
the communication hole is formed such that the second opening is located on a bottom surface of the recess, and
the shielding wall is configured by a side wall of the recess.

5. An electronic device comprising:
a circuit board on which an electronic component is mounted;
a housing that has an opening portion and accommodates the circuit board; and
a connector that includes a connection terminal that enables electrical connection of the circuit board to an external connector, and a connector housing that holds the connection terminal and closes the opening portion of the housing,
wherein the connector has at least three communication holes that penetrate the connector housing and allow an internal space and an external space of the housing to communicate with each other,
the electronic device further includes a filter which is attached to the connector housing so as to entirely cover a first opening opened to an internal space side of the housing in the at least three communication holes and through which air passes, and
the at least three communication holes are formed such that at least one of second openings opened to an external space side of the housing is arranged to be shifted from a straight line,
wherein the connector housing bulges toward an external space side of the housing, and a central portion of the connector housing has a convex portion of a top portion, and
the at least three communication holes are formed such that the second openings are all located on a surface of the convex portion,
wherein the at least three communication holes are formed such that the second openings are dispersedly arranged along a peripheral portion of the convex portion.

6. The electronic device according to claim 5,
wherein the at least three communication holes are formed such that distances between second openings of adjacent communication holes are same.

7. The electronic device according to claim 5,
wherein each of the at least three communication holes is formed to satisfy $H \geq D$, where D is a hole diameter of each communication hole and H is a length of each communication hole.

8. The electronic device according to claim 5,
wherein the at least three communication holes are formed such that ventilation resistance of all the at least three communication holes is equal to or less than ventilation resistance of the filter.

9. The electronic device according to claim 5,
wherein the at least three communication holes are formed to have different hole diameters from each other.

10. The electronic device according to claim 5,
wherein all of the at least three communication holes are formed to have a hexagonal outline shape.

11. The electronic device according to claim 5,
wherein the convex portion is formed such that an outer surface thereof has a curved surface with a constant curvature.

12. The electronic device according to claim 5,
wherein the convex portion is formed to have a triangular pyramid shape, and
the at least three communication holes are formed such that the second openings are located on three surfaces constituting an outer surface of the convex portion.

13. The electronic device according to claim 5,
wherein the connector housing has a partition wall portion protruding toward an external space side of the housing at a position between adjacent communication holes of the at least three communication holes.

14. The electronic device according to claim 13,
wherein the connector housing further includes a shielding wall that surrounds a periphery of the second opening of the at least three communication holes and protrudes toward an external space side of the housing from the second opening, and
the partition wall portion is formed to be connected to the shielding wall.

15. The electronic device according to claim 13,
wherein the connector housing has a separation inner wall portion that separates the at least three communication holes from each other and constitutes some of inner walls of the at least three communication holes, and
the separation inner wall portion is continuous with a base end of the partition wall portion at a position of the second opening, and has a cross-sectional shape identical to at least a part of a cross-sectional shape of the partition wall portion.

* * * * *